(12) United States Patent
Vadlamani et al.

(10) Patent No.: US 11,610,706 B2
(45) Date of Patent: Mar. 21, 2023

(54) RELEASE LAYER-ASSISTED SELECTIVE EMBEDDING OF MAGNETIC MATERIAL IN CORED AND CORELESS ORGANIC SUBSTRATES

(71) Applicant: Intel Corporation, Santa Clara, CA (US)

(72) Inventors: Sai Vadlamani, Chandler, AZ (US); Prithwish Chatterjee, Tempe, AZ (US); Rahul Jain, Chandler, AZ (US); Kyu Oh Lee, Chandler, AZ (US); Sheng C. Li, Gilbert, AZ (US); Andrew J. Brown, Chandler, AZ (US); Lauren A. Link, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 1002 days.

(21) Appl. No.: 15/870,302

(22) Filed: Jan. 12, 2018

(65) Prior Publication Data

US 2019/0221345 A1 Jul. 18, 2019

(51) Int. Cl.
| | |
|---|---|
| *H01F 1/42* | (2006.01) |
| *H01F 27/38* | (2006.01) |
| *B32B 27/38* | (2006.01) |
| *C22C 45/04* | (2006.01) |
| *H01F 17/00* | (2006.01) |
| *H01L 23/498* | (2006.01) |
| *H01F 27/28* | (2006.01) |
| *H01L 21/56* | (2006.01) |
| *H01F 17/06* | (2006.01) |

(52) U.S. Cl.
CPC .............. *H01F 1/42* (2013.01); *B32B 27/38* (2013.01); *C22C 45/04* (2013.01); *H01F 17/0033* (2013.01); *H01F 27/2804* (2013.01); *H01F 27/38* (2013.01); *H01L 21/56* (2013.01); *H01L 23/498* (2013.01); *H01F 17/062* (2013.01)

(58) Field of Classification Search
CPC ..... B32B 27/38; C22C 45/04; H01F 17/0033; H01F 27/2804; H01F 27/38; H01L 23/498
See application file for complete search history.

(56) References Cited

U.S. PATENT DOCUMENTS

| | | | |
|---|---|---|---|
| 6,255,714 B1* | 7/2001 | Kossives | H01F 17/0006 |
| | | | 257/528 |
| 6,996,892 B1 | 2/2006 | Dening et al. | |
| 9,781,834 B1* | 10/2017 | Sturcken | H01F 17/0033 |
| 2010/0059258 A1* | 3/2010 | Yang | B32B 27/08 |
| | | | 174/257 |

(Continued)

OTHER PUBLICATIONS

Office Action for German Patent Application No. 102018131304.7, dated Feb. 21, 2019. No translation available.

(Continued)

*Primary Examiner* — Michael Jung
(74) *Attorney, Agent, or Firm* — Essential Patents Group, LLP.

(57) ABSTRACT

A substrate for an integrated circuit package, the substrate comprising a dielectric, at least one conductor plane within the dielectric, and a planar magnetic structure comprising an organic magnetic laminate embedded within the dielectric, wherein the planar magnetic structure is integrated within the at least one conductor plane.

12 Claims, 13 Drawing Sheets

(56) References Cited

U.S. PATENT DOCUMENTS

2010/0295646 A1* 11/2010 Harrison .............. H01F 41/046
                                                      336/192
2014/0034373 A1   2/2014 Yoshikawa et al.
2018/0075965 A1*  3/2018 Yoshioka .............. H01F 27/292
2018/0240729 A1*  8/2018 Kim ....................... H01L 24/16

OTHER PUBLICATIONS

Office Action and English translation for German Patent Application No. 102018131304.7, dated Jan. 19, 2023.

* cited by examiner

RELEASE LAYER-ASSISTED SELECTIVE EMBEDDING OF MAGNETIC MATERIAL IN CORED AND CORELESS ORGANIC SUBSTRATES

BACKGROUND

In designing architectures for Integrated Circuit (IC) packages, power delivery is an important consideration. As processor capabilities increase, larger demands are placed on power delivery systems. High switching speeds are important achieving performance demands placed on small footprint integrated voltage regulators. Therefore, on-substrate inductors are an important aspect of improving power delivery performance. Current solutions involve attachment of stand-alone discrete inductors on the land side of the package, or integration of air-core inductors on the substrate. In an ideal scenario, superior power delivery performance can be achieved by embedding inductor materials in the substrate, for instance, on the land side of the package as close to the core as possible for cored substrates.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
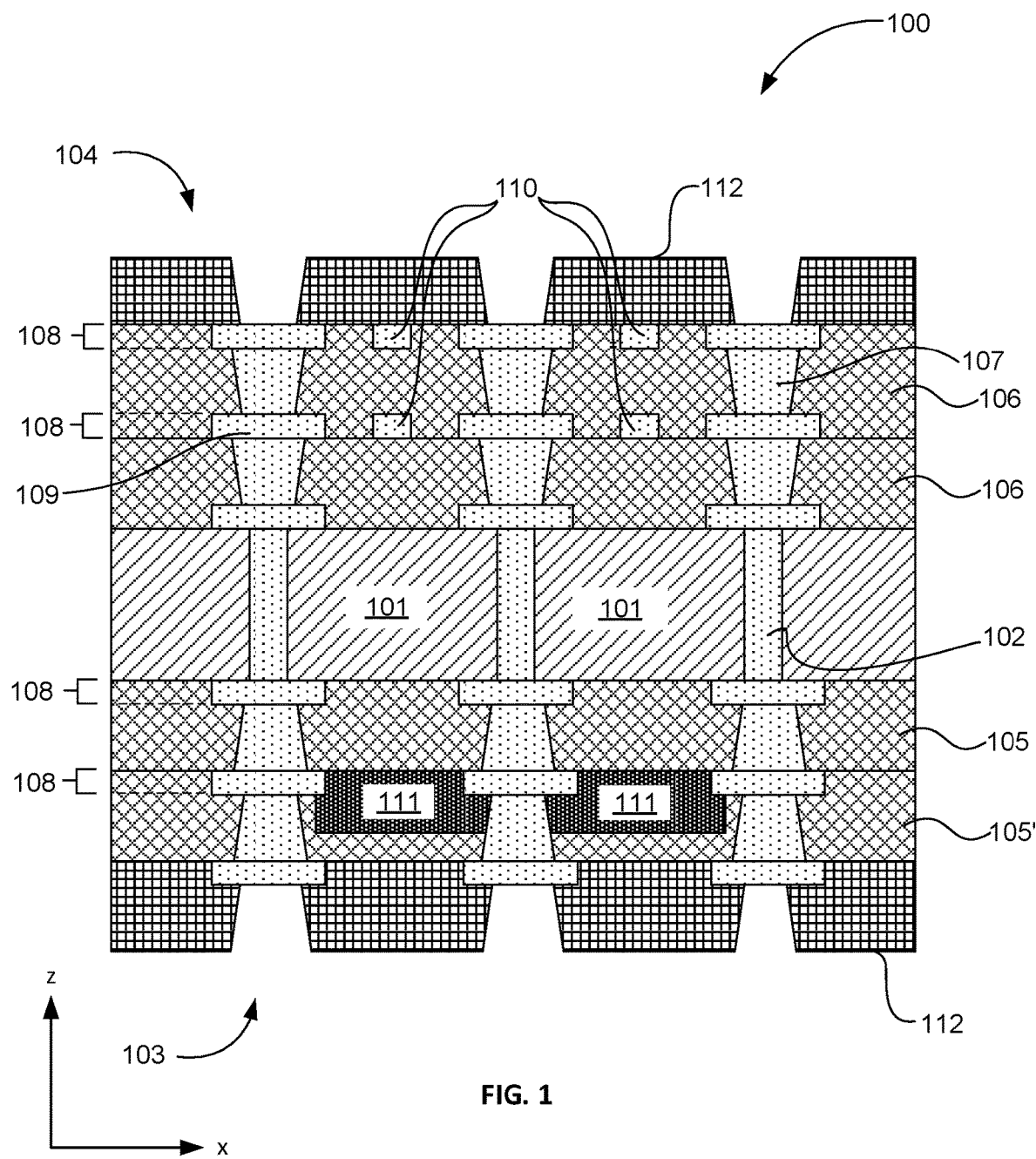
FIG. 1 illustrates a cross sectional view of an Integrated Circuit (IC) package having a cored substrate and an organic magnetic film embedded within the substrate, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Disclosed herein is an IC package having an organic magnetic film embedded in the substrate of the IC package, and a method for making same. The substrate of the IC package comprises a core in some embodiments, and is coreless in some embodiments. A planar magnetic structure is embedded within the substrate. In some embodiments, the substrate comprises layers or structures, where the layers or structures are laminae of dielectric material interleaved with conductor planes. In some embodiments, the planar magnetic structure is inlaid within a conductor plane. In some embodiments, the planar magnetic structure is inlaid within a dielectric plane (e.g., lamina). In some embodiments, the substrate comprises a molded dielectric encapsulation over conductive structures. In some embodiments, the planar magnetic structure is inlaid within the molded dielectric encapsulation.

In some embodiments, the substrate is a cored substrate. The planar magnetic structure is integrated within dielectric layers on one side of the core. In some embodiments, the substrate comprises a land side, where the land side comprises contacts for bonding (e.g., bond pads) for attachment of the IC package to a printed circuit board or another package (package-on-package, PoP). In some embodiments, the land side comprises a ball grid array (BGA) of solder bumps. In some embodiments, the planar magnetic structure is integrated on the land side of the core.

In some embodiments, the substrate is a coreless substrate. In some embodiments, a planar magnetic structure is integrated within the dielectric of the coreless substrate. In some embodiments the planar magnetic structure is integrated within a conductor plane of the coreless substrate. In some embodiments, the planar magnetic structure is integrated within the dielectric of the coreless substrate near the land side of the substrate.

In some embodiments, the planar magnetic structure is an organic laminate film. The organic laminate film may comprise magnetic particles embedded within a polymer matrix. In some embodiments, the planar magnetic structure is an inductor core. In some embodiments, the substrate comprises an inductor winding. In some embodiments, the inductor winding is within a conductor plane within the substrate. In some embodiments, the inductor winding is within two conductor planes. In some embodiments, the inductor is a flat pancake or spiral inductor, contained within a single conductor plane over the inductor core, which is in a parallel plane within the substrate of the IC package. In some embodiments, the inductor winding is a solenoid winding, wrapping around the inductor core.

An aspect of the disclosure is the method of fabrication of IC package substrate having an integrated planar magnetic structure, where the planar magnetic structure is patternable to conform to any desired shape and architecture. In some embodiments, non-lithographic methods are used to pattern the planar magnetic structure or structures. In some embodiments, the planar magnetic structure is derived from flexible polymeric magnetic films.

The films may comprise magnetic particles in a polymer matrix. In some embodiments, the magnetic particles are ferromagnetic particles, such as mesoscale powdered iron or magnetite particles. In some embodiments, the particles are paramagnetic particles. Examples are nanocrystalline gamma-iron oxide ($\gamma$-$Fe_2O_3$), magnetite ($Fe_3O_4$), In some embodiments, the magnetic particles are ferrimagnetic materials, such as ferrites.

In some embodiments, patterned islands of a release layer are formed on a substrate. In some embodiments, the magnetic film is laminated over the islands of the release layer. In some embodiments, the release layer is a paste that is printable by inkjet methods. In some embodiments, the release layer is a laminate film. The release layer comprises an anti-adhesion material, and has a weak adhesion to the underlying substrate. If a subsequent layer or any material is deposited or laminated over the release layer, it may not have a permanent adhesion to the underlying substrate. Release layers are employed for the purpose of forming a removable foundation under portions of the overlying layer that are to be removed downstream in the process flow.

As such, it is easily removed by mechanical means, such as peeling the release layer from the substrate. The magnetic film is laminated over the release layer, and over selected regions of the bare substrate where openings in the release layer are located, according to some embodiments. In some embodiments, separations are made in the magnetic film by laser skiving along the edges of the islands of the release layer. Cutouts of magnetic film are formed over the islands of release layer. Release layer islands are then removed, carrying the cutout portions of magnetic film. This leaves magnetic film adhering to the selected regions of substrate.

In some embodiments, the laminated magnetic film may be cut to arbitrary shapes. In some embodiments, laser ablation (e.g., skiving) may be used to make cuts in the laminated magnetic film, forming islands or cutout sections to either remove from the substrate or leave on the substrate. For laser skiving methods, lithography may not be employed, saving processing time and expense. However, laser stop layers are used to prevent the laser from cutting deeper than the layer of interest. Thin metal layers are known to form effective laser stop layers. In some embodiments, a thin metal layer is deposited as a basal layer over the substrate and release layer.

The magnetic film may be cut into arbitrary shapes to form integrated planar magnetic inductor cores for inductors integrated into the substrate of the IC package. In conductor layers in an IC package substrate, package-level integrated inductor windings may be formed within the conductor layers above and/or below the level or layer within which the planar magnetic core is located. In some embodiments, conductor layers (e.g., conductive levels within the substrate along the z-dimension) are interleaved with layers of dielectric within the substrate of the IC package. In some embodiments, once a magnetic film is laminated and shaped over a substrate layer during package fabrication, a subsequent layer of dielectric may be laminated over the planar magnetic structure (e.g., planar inductor core).

In some embodiments, layers are stacked in the z-dimension. In some embodiments, planar magnetic structures are formed in a dielectric layer of the substrate. In some embodiments, planar magnetic structures are formed in a conductor plane of the substrate. In some embodiments, multiple planar magnetic structures are formed in two or more layers of the substrate. In some embodiments, multiple planar magnetic structures are stacked in adjacent substrate levels, for example, to increase the inductance of an integrated inductor or focus lines of magnetic flux into a smaller volume of the IC package.

In some embodiments, an x-y-z Cartesian coordinate system is used to describe relative orientations. The plane of the substrate is subtended by the x- and y axes, orthogonal to the z-axis. In some embodiments, integrated planar magnetic cores are formed at optimal locations within the plane of the substrate of the IC package. As an example, package-level integrated voltage regulators (IVRs) and fully-integrated voltage regulators (FIVRs) are integrated into the substrate of the IC package. In some embodiments, FIVRs, and some other integrated voltage regulators, employ buck conversion technologies for power conversion, typically to match the power available on the motherboard to the on-package die power requirements. Buck conversion topologies generally include one or more inductors. In some embodiments, a package-level integrated inductor is at the heart of the FIVR. According to some embodiments, the disclosed method enables improved package architectures employing devices such as IVRs and FIVRs, where the voltage regulators are placed at strategic locations within the IC package for optimized power distribution to on-package dies.

More flexible package architectures having the planar magnetic structure closer to the land side of the package are enabled. Power delivery performance of IVRs and FIVRs may be improved by such IC package architectures. In some embodiments, the planar magnetic structures are asymmetrically integrated into cored package substrates, where the magnetic structures are integrated by embedding in the substrate on one side (e.g., the land side) of the substrate core. Here, the planar magnetic structure may be close to the package interconnect plane (e.g., a BGA plane), thus nearer to the motherboard. Package assembly processing to achieve this architecture may be contrasted to conventional package assembly processes, where buildup of the package is symmetrical. Modest modifications to more conventional symmetric cored package assembly line tooling may be implemented to enable asymmetric architectures.

For coreless substrates, planar magnetic structures may be integrated into the package closer to the beginning of the assembly process, where the lowest levels of the substrate are formed.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "cored" generally refers to a substrate of an IC package built upon a board, card or wafer comprising a non-flexible stiff material. Typically, a small printed circuit board is used as a core, upon which IC dies and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an IC package having no core. The lack of a core allows for higher-density package architectures. as the through-vias have a relatively large dimensions and pitch compared to high-density interconnects.

Here, the term "land side" generally refers to the side of the substrate of the IC package closest to the plane of attachment to a printed circuit board, motherboard, or other package. This is in contrast to the term "die side", which is the side of the substrate of the IC package to which the die or dies are attached.

Here, the term "dielectric" generally refers to any number of non-conductive materials that make up the structure of a package substrate. For purposes of this disclosure, dielectric material may be incorporated into an IC package as layers of laminate film or as a resin molded over IC dies mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in microelectronic packages and dies. The term "solder pad" may be occasionally substituted for "bond pad", and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1 illustrates a cross sectional view of Integrated Circuit (IC) package substrate 100 having a cored substrate and an organic magnetic film embedded within the substrate, according to some embodiments of the disclosure.

In FIG. 1, substrate 100 comprises core 101 and through-vias 102 extending through core 101. In some embodiments, core 101 is a silicon die. In some embodiments, core 101 is a printed circuit board. In some embodiments, core 101 divides substrate 100 into land side 103 and die side 104, and land-side dielectric layers 105 and die-side dielectric layers 106 adjacent to core 101. In some embodiments, dielectric layers 105 and 106 comprise materials including, but not limited to, epoxy resins. In some embodiments, within land-side dielectric layers 105 and die-side dielectric layers 106 are plated vias 107 extended through the thickness of dielectric layers 105 and 106, interconnecting conductor planes 108. In some embodiments, plated vias 107 comprise metals such as copper, nickel and gold. In some embodiments, conductor planes 108 are on both the land side and die side of substrate 100, and are not distinguished. Conductor planes 108 may comprise conductive structures, such as pads 109 and traces 110. In some embodiments, pads 109 and traces 110 comprise materials such as, but not including, copper, nickel and gold. In some embodiments, a solder mask layer 112 is at the top level of substrate 100 to facilitate solder bumping. In some embodiments, traces 110 are inductor windings.

In some embodiments, via 107 extends through planar magnetic structure 111. In the illustrated embodiment, planar magnetic structure 111 is structurally part of dielectric layer 105, and metallization architectures such as vias 107 and pads 109 may be integrated in and around planar magnetic structure 111.

On land-side 103 of core 101, planar magnetic structure 111 is a magnetic laminate embedded within one land side dielectric layer 105. In some embodiments, planar magnetic structure 111 is within conductor plane 108. In some embodiments, planar magnetic structure is directly adjacent to core 101. In some embodiments, planar magnetic structure 111 comprises magnetic particles embedded in a polymer matrix. In some embodiments, the polymer matrix comprises an epoxy resin. In some embodiments, the magnetic particles comprise materials such as, but not limited to, nanocrystalline gamma-iron (ferric) oxide ($\gamma$-$Fe_2O_3$) and magnetite ($Fe_3O_4$). In some embodiments, the magnetic particles comprise materials, such as, but not limited to, ferrites. In some embodiments, the magnetic particles comprise materials, such as, but not limited to, iron, nickel, cobalt, molybdenum, lanthanide series element (e.g., neodymium, samarium, gadolinium, etc.), and mixtures or alloys thereof.

In some embodiments, ferromagnetic materials are formed of CFGG (i.e., Cobalt (Co), Iron (Fe), Germanium (Ge), or Gallium (Ga) or a combination of them). In some embodiments, ferromagnetic materials comprise one or more of Co, Fe, Ni alloys and multilayer heterostructures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

Figure 2:
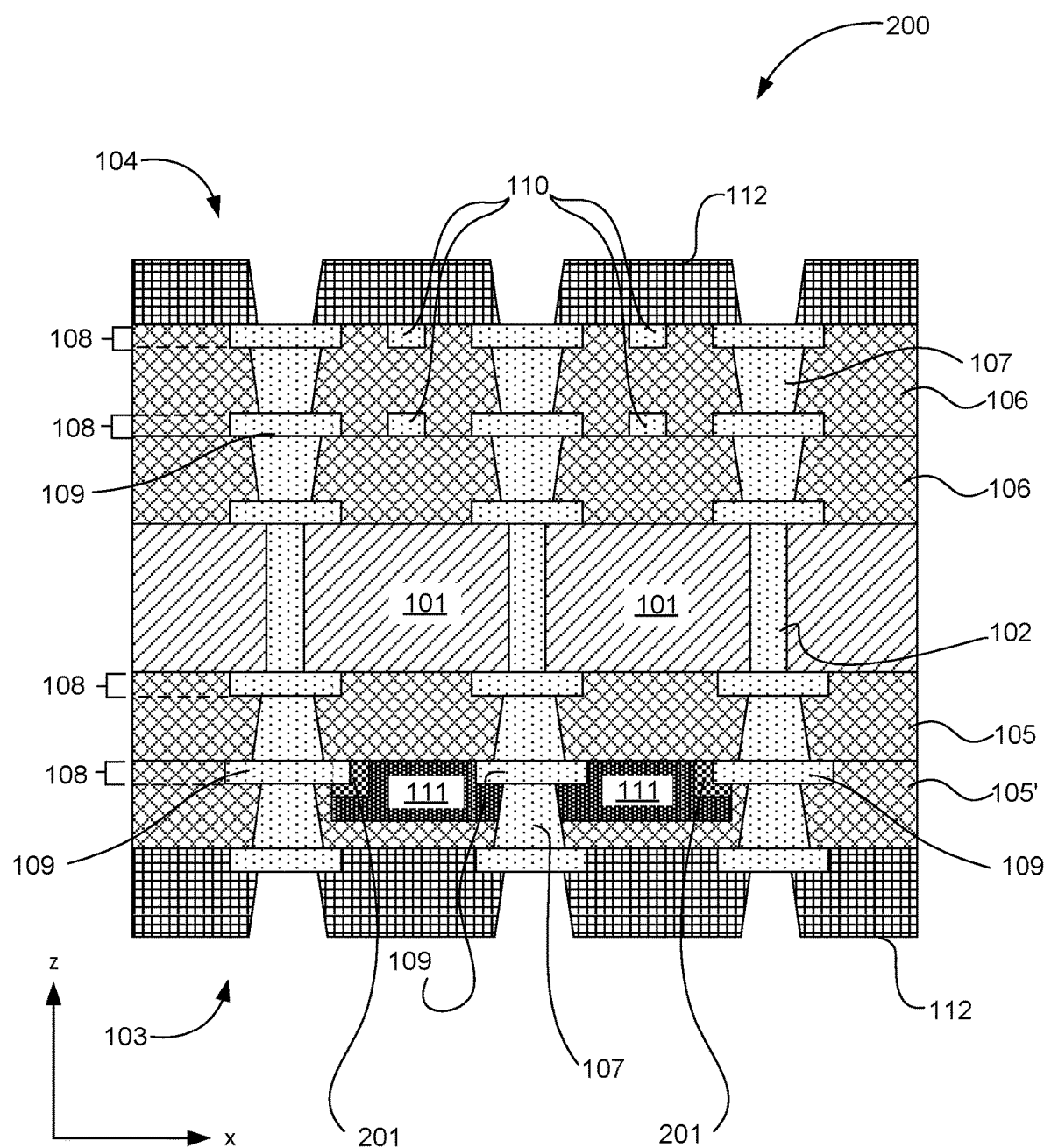
FIG. 2 illustrates a cross-sectional view of an IC package having an organic magnetic film embedded within the substrate, according to some embodiments of the disclosure.

FIG. 2 illustrates a cross-sectional view of IC package substrate 200 having an organic magnetic film embedded within the substrate, according to some embodiments of the disclosure.

In FIG. 2, substrate 200 comprises core 101, through-vias 102 extending through core 101. Materials and structural details utilized in core 101 have been generally described above for substrate 100. In some embodiments, planar magnetic structure 111 is within conductor plane 108. In the illustrated embodiment, release layer portions 201 are between planar magnetic structure 111 and a metal structure within conductor plane 108 such as pad 109. In some embodiments, planar magnetic structure 111 is over release layer material within dielectric layer 105. Release layer 201 comprises materials such as, but not limited to, boron nitride and polyvinyl alcohol. In some embodiments, planar magnetic structure is directly adjacent to core 101.

In some embodiments, via 107 extends through planar magnetic structure 111. In the illustrated embodiment, planar magnetic structure 111 is structurally part of dielectric layer 105, and metallization architectures such as vias 107 and pads 109 may be integrated in and around planar magnetic structure 111. In some embodiments, metallization structures include traces 110. In some embodiments, traces 110 are inductor windings.

Figure 3:
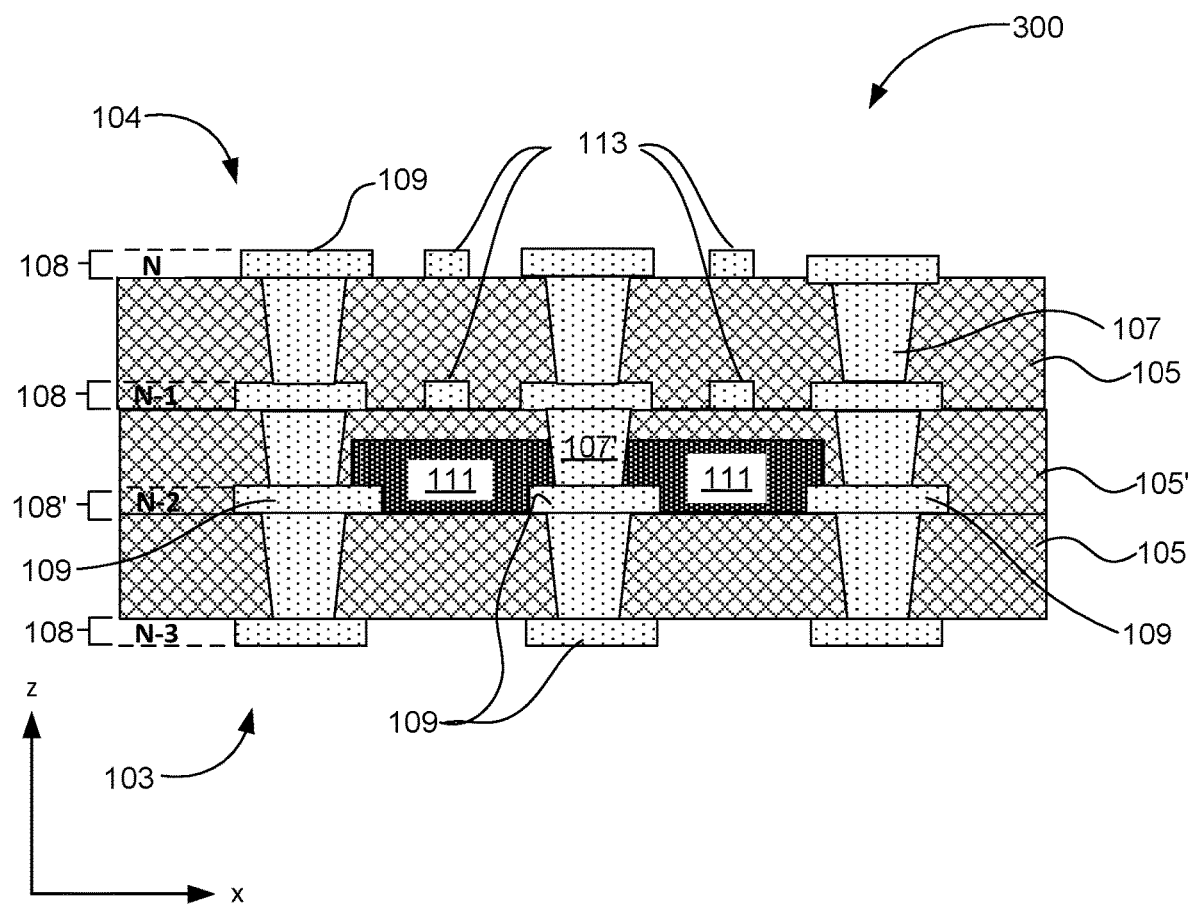
FIG. 3 illustrates a cross-sectional view of a coreless substrate having an embedded organic magnetic film, according to some embodiments of the disclosure.

FIG. 3 illustrates a cross-sectional view of coreless substrate 300 having an embedded organic magnetic film, according to some embodiments of the disclosure.

Planar magnetic structures may also be integrated in coreless substrates. In FIG. 3, coreless substrate 300 comprises planar magnetic structure 111 embedded in a dielectric layer 105'. Coreless substrate 300 comprises dielectric layers 105 (including 105') that are interleaved with conductor levels 108 (including 108'). Labels N, N–1, N–2 and N–3 designate conductor levels from the base level N–3 on land side 103 of coreless substrate 300 to top level N on die side 104. In some embodiments, planar magnetic structure 111 is embedded at in a level near land side 103 of coreless substrate 300. In some embodiments, conductive levels 108 (levels N, N–1, N–2 and N–3) are interleaved with dielectric layers 105. Planar magnetic structure 111 abuts dielectric material in a dielectric layer 105'. Planar magnetic structure 111 abuts metallization structures, such as pads 109, in conductive level 108' (N–2). In some embodiments, metallization structures, such as via 107', extend through the body of planar magnetic structure 111.

In some embodiments, metallization structures include inductor windings 113. In some embodiments, inductor windings 113 are integrated in a single conductor level 108. In some embodiments, inductor windings are integrated in multiple conductor levels 108 (e.g., levels N and N–1, as shown in FIG. 3). Substrate 300 comprises solder mask 112 for facilitating solder bumping. In some embodiments, inductor windings 113 are integrated in top conductor level N, at a level below level N on die side 104.

FIGS. 4A-4J illustrate cross-sectional views of an exemplary fabrication method for fabricating the first embodiment of IC package 100 having an organic magnetic film embedded within the substrate, according to some embodiments of the disclosure.

Figure 4A:
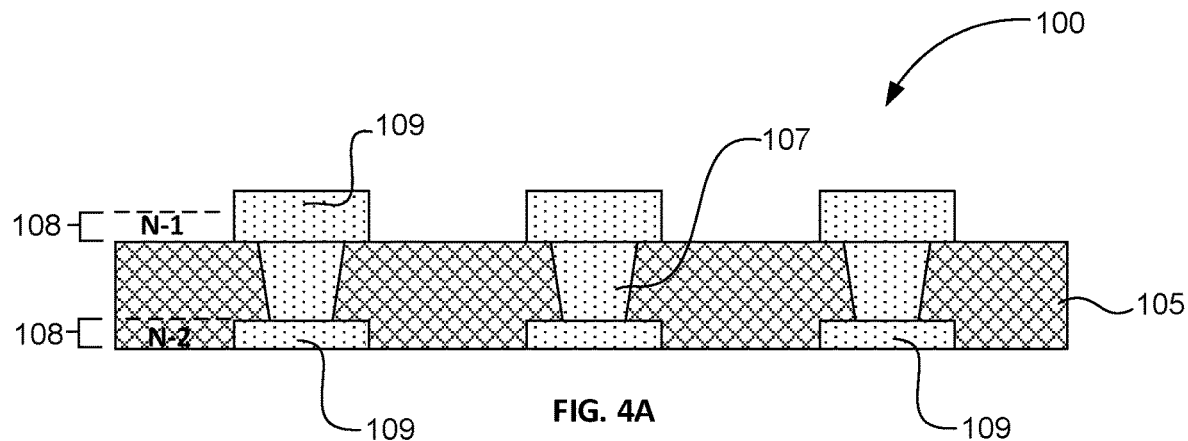
FIGS. 4A-4J illustrate cross-sectional views of an exemplary fabrication method for fabricating the first embodiment of the IC package having an organic magnetic film embedded within the substrate, according to some embodiments of the disclosure.

In the operation shown in FIG. 4A, substrate 100 is received in a partially completed state. For simplicity, only layer 105 is shown, however, it is understood that dielectric layer 105 overlays core 101 (not shown), on land side 103, as shown in FIG. 1. Conductor levels 108 corresponds to level N–2, nearest to core 101 (as shown in FIG. 1), and level N–1.

In the illustrated embodiment, substrate 100 is received with metallization structures formed in previous operations. Conductor levels 108 comprise pads 109, interconnected by vias 107 that extend through dielectric layer 105.

Figure 4B:
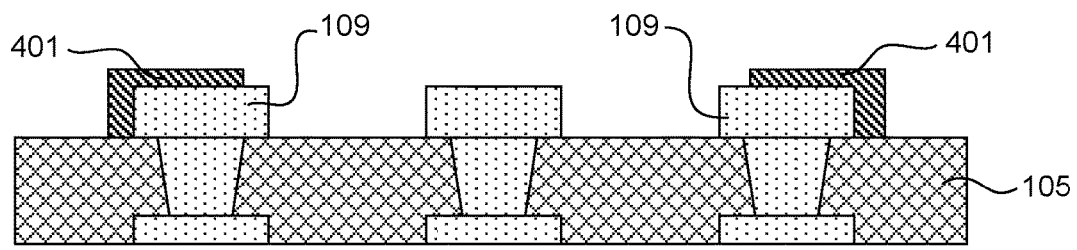

In the operation shown in FIG. 4B, islands of release layer 401 are formed at selected sites on substrate 100. In some embodiments, islands of release layer 401 are formed non-lithographically by inkjet printing methods. Release layer 401 comprises anti-adhesive materials such as, but not limited to, boron nitride and polyvinyl alcohols. In the illustrated embodiment, defined islands of release layer 401 are formed partially over pads 109 and dielectric 105 by paste printing methods. Release layer 401 forms a weakly adhesive layer that may be removed by mechanical delamination methods, such as peeling the layer off of substrate 100. Materials overlying release layer 401 are easily removed by facile mechanical delamination of release layer 401.

Figure 4C:
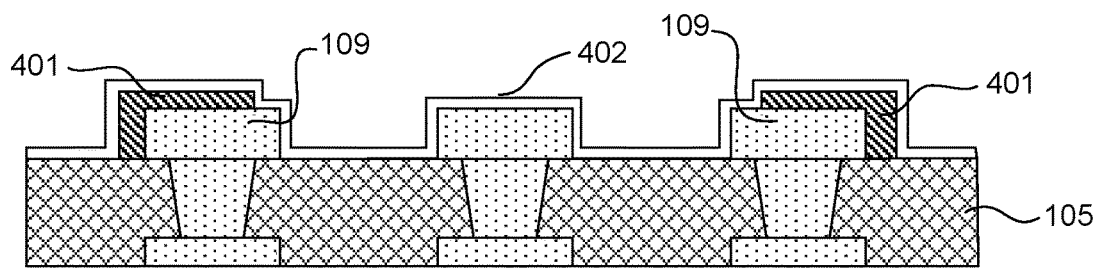

In the operation shown in FIG. 4C, metal layer 402 is deposited over substrate 100, covering release layer 401, dielectric 105 and pads 109. In some embodiments, metal layer 402 comprises metals such as, but not limited to, copper, gold or aluminum. In some embodiments metal layer 402 comprises electroless copper having a thickness of 1 micron or greater. Metal layer 402 functions as a laser stop layer in downstream operations.

Figure 4D:
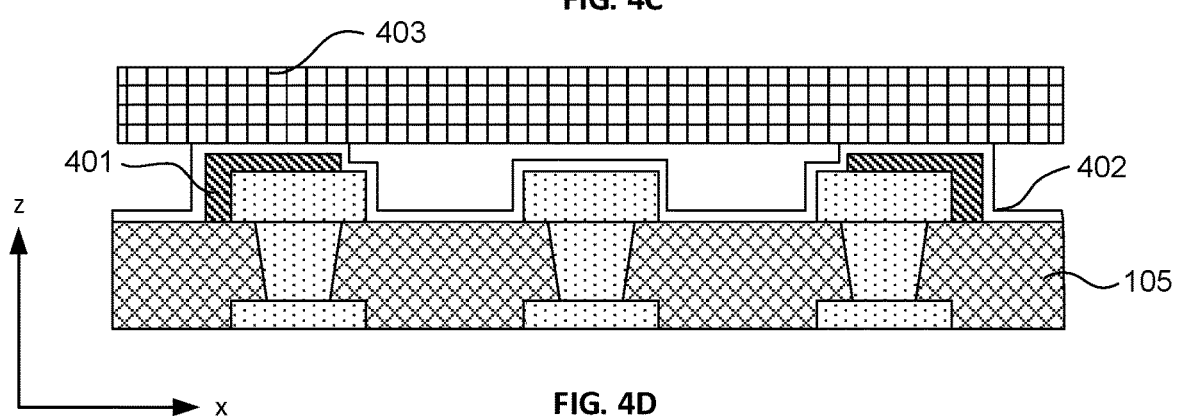

In the operation shown in FIG. 4D, photoresist layer 403 covers substrate 100. In some embodiments, photoresist layer is a dry film resist that is laminated over substrate 100. In the illustrated embodiment, photoresist layer 403 is non-conformal to the surface relief of substrate 100. In some embodiments, the dry film resist is a negative tone resist that is laminated at temperatures above 100° C. In some embodiments, photoresist layer 403 has a thickness ranging up to 100 microns.

Figure 4E:
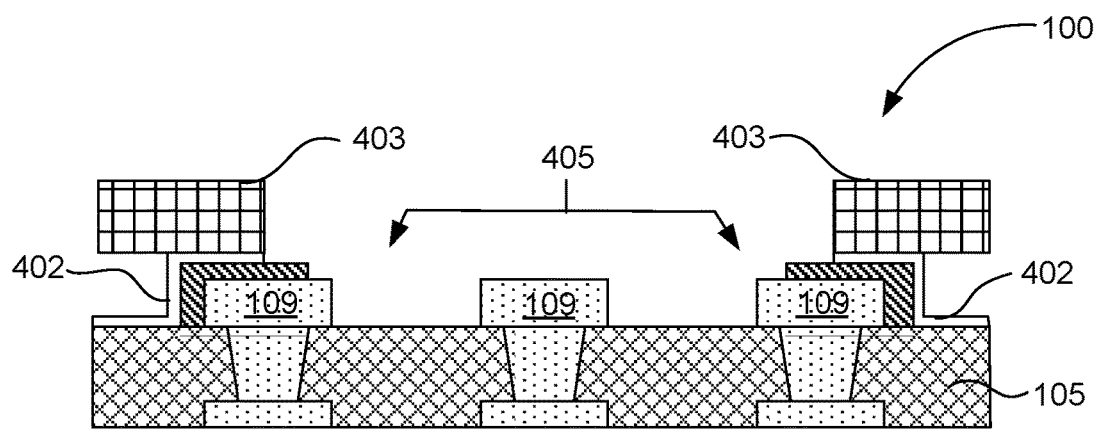

In the operation shown in FIG. 4E, photoresist layer 403 is patterned to form opening 404 over selected region 405 of substrate 100. In some embodiments, photoresist layer 403 is a negative tone resist, and photo-exposed regions are developed in a mildly alkaline aqueous solution (e.g., sodium carbonate) at slightly elevated temperatures. Metal layer 402 is patterned by removal within exposed region 405, and retention under remaining portions of photoresist layer 403. In some embodiments, metal layer 402 is removed by a flash etch within selected region 405. In some embodiments, metal layer 405 is etched for several seconds to remove the metal by suitable liquid etchant. In some embodiments, metal layer 405 comprises copper, and is etched by a short (e.g., several seconds) dip in iodine/iodide etchant.

Figure 4F:
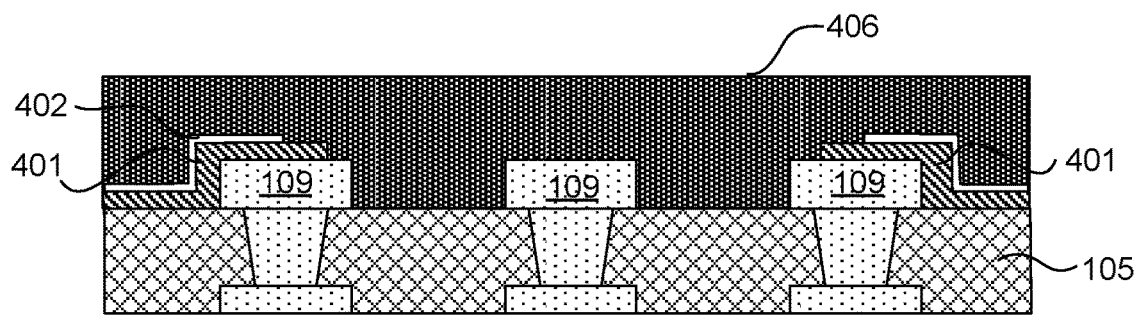

In the operation shown in FIG. 4F, photoresist layer 403 has been removed in a previous operation. Any suitable photoresist strip method may be employed. In some embodiments, photoresist layer 403 is stripped in a sodium hydroxide solution at room temperature. Still referring to the operation shown in FIG. 4F, after removal of photoresist layer 403, magnetic film 406 is laminated over substrate 100. In some embodiments, magnetic film 406 forms a conformal layer over substrate 100, following surface relief comprising release layer 401, pads 109 and metal layer 402. In some embodiments, magnetic film 406 is laminated by standard film lamination equipment that may be already present in existing processes of record (POR). In some embodiments, magnetic film 406 is first laminated over substrate 100, covering islands of release layer 401, then thermally activated for adhesion. In some embodiments, magnetic film 406 comprises magnetic particles embedded in a polymer matrix. Details of the composition of magnetic film 406 are described above (e.g., planar magnetic structure 111 in FIGS. 1-3). In some embodiments, the polymer matrix comprises epoxy resins, similar to the composition of dielectric 105. In some embodiments, the polymer matrix component of magnetic film 406 is chemically bonded to dielectric 105.

Figure 4G:
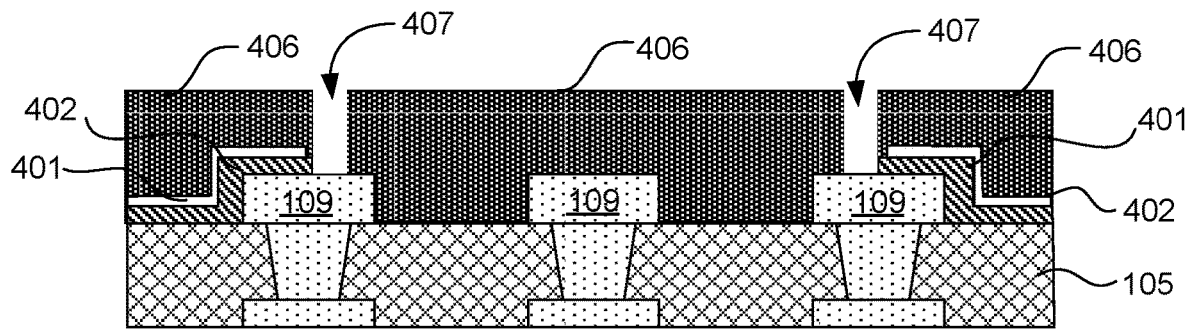

In the operation shown in FIG. 4G, magnetic film 406 is patterned to form isolated islands of magnetic film 406, In some embodiments, the isolated islands of magnetic film 406 are formed by laser ablation, where cuts 407 are made in magnetic film 406 by laser skiving along lines coinciding with the edges of underlying islands of release layer 401 (covered by metal layer 402). The laser cutting process separates islands of magnetic film 406 overlying islands of release layer 401 from islands of magnetic film 406 adhering to the surface relief of substrate 100. In some embodiments, the surface relief comprises islands of release layer 401 and metallization, such as pads 109, and dielectric 105.

Figure 4H:
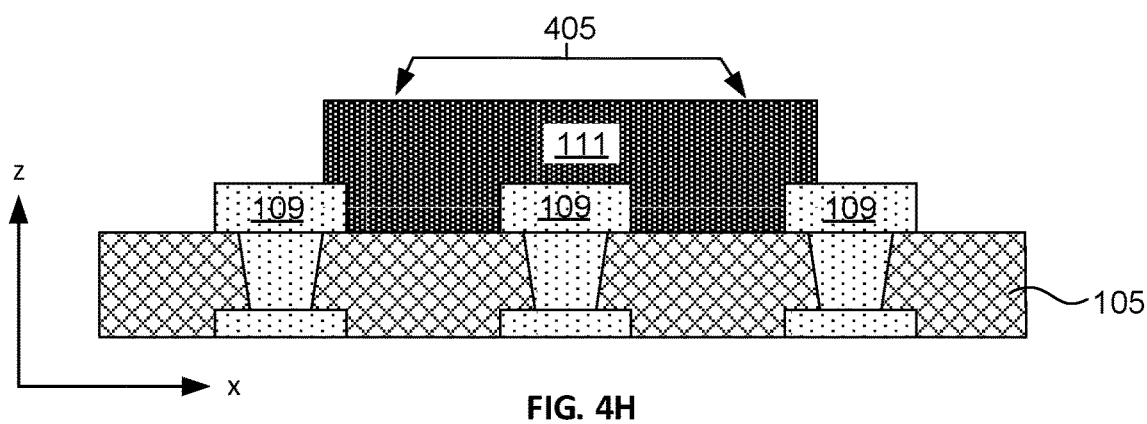

In the operation shown in FIG. 4H, release layer 401 is removed by mechanical delamination methods described above, leaving islands of magnetic film 406 in selected regions 405. In the illustrated embodiment, the island of magnetic film 406 is equivalent to planar magnetic structure 111 shown in FIGS. 1-3. In selected regions 405, islands of magnetic film 406 (now planar magnetic structure 111) adhere to dielectric 105 and metallization structures such as pads 109, according to some embodiments. In some embodiments, release layer 401 is removed by treatment in an ultrasonic bath. Isolated islands of magnetic film 406 and metal layer 402 overlying release layer 401 are simultaneously removed, leaving islands of magnetic film 406 in selected regions 405.

Figure 4I:
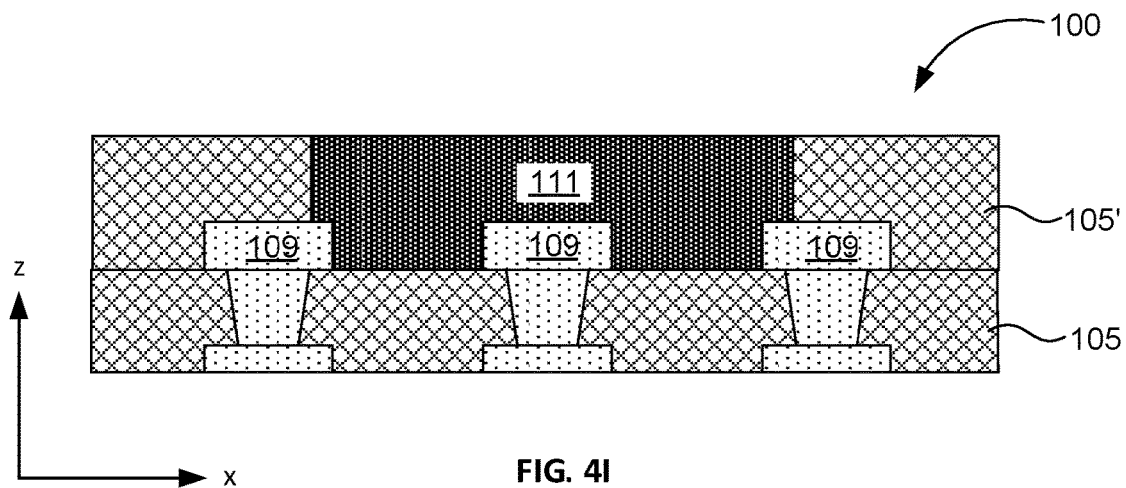

In the operation shown in FIG. 4I, dielectric layer 105' is laminated over substrate 100, covering surface relief comprising planar magnetic structure 111, metallization structures such as pads 109, and dielectric 105. In some embodiments, dielectric layer 105' forms a conformal layer over the surface relief of substrate 100. In some embodiments, dielectric layer 105' is planarized with planar magnetic structure 111. In some embodiments, dielectric layer 105' is planarized by chemomechanical polishing (CMP) techniques.

Figure 4J:
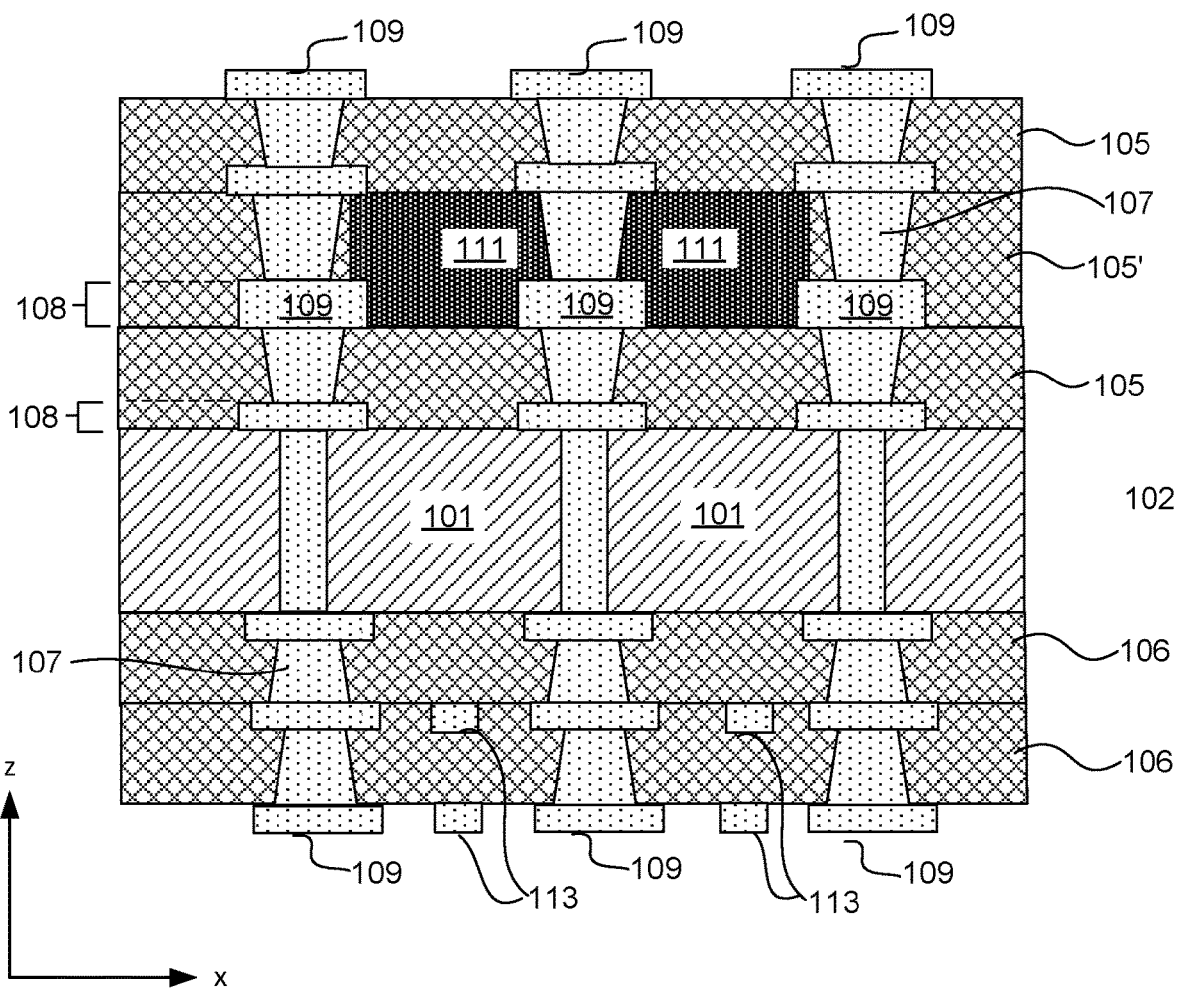

In FIG. 4J, substrate 100 is shown in the context of the completed structure as a whole, as shown in FIG. 1, including core 101, dielectric layers 105 and 106, and inductor windings 113. Metallization structures such as vias 107 are formed by known methods such as patterning of dielectric layers 105 and 106 by laser drilling and electroplating. In some embodiments, pads 109 are formed by first forming conductive levels 108 over dielectric layers 105 and 106 as these layers are made, by techniques such as electroless deposition of copper. Pads 109 may be formed by lithographic patterning of conductor levels 108. These techniques are typically standardized in package assembly processes of record (POR). In some embodiments, the addition of planar magnetic structures 111 in substrate 100 is implemented without significant modifications or additions to package assembly PORs.

FIGS. 5A-5L illustrate cross-sectional views of an exemplary fabrication method for fabricating the second embodiment of the IC package having an organic magnetic film embedded within the substrate, according to some embodiments of the disclosure.

Figure 5A:
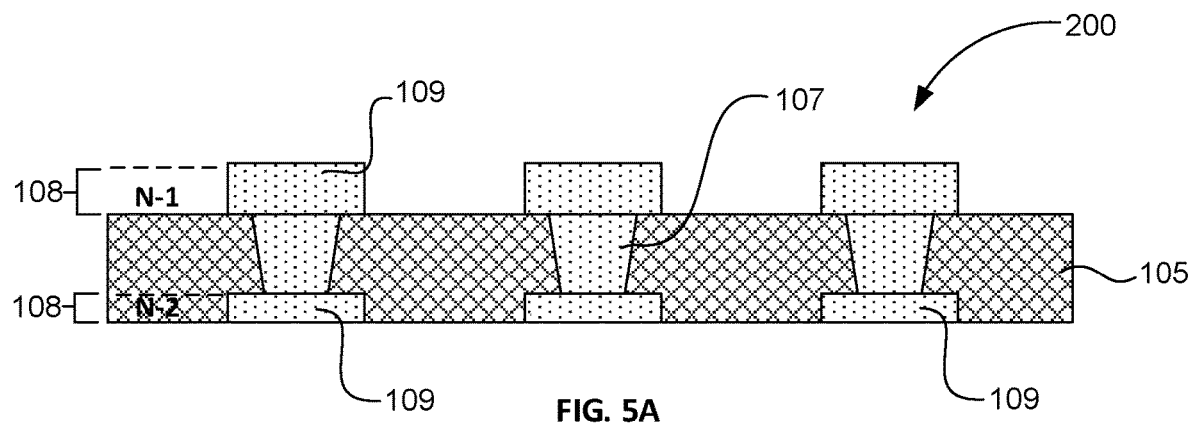
FIGS. 5A-5L illustrate cross-sectional views of an exemplary fabrication method for fabricating the second embodiment of the IC package having an organic magnetic film embedded within the substrate, according to some embodiments of the disclosure.

In the operation shown in FIG. 5A, substrate 200 is received in a partially competed state. Conductor levels 108 corresponds to level N–2, nearest to core 101 (as shown in FIG. 2), and level N–1. As for FIG. 4A, only layer 105 is shown for simplicity. Substrate 200 is a cored substrate, shown in FIG. 2 as the completed structure. In the illustrated embodiment, substrate 200 is received with metallization structures formed in the previous operations. Conductor levels 108 at levels N–2 (e.g., closest to the core) and N–1 of substrate 200 comprise pads 109, interconnected by vias 107 that extend through dielectric layer 105.

Figure 5B:
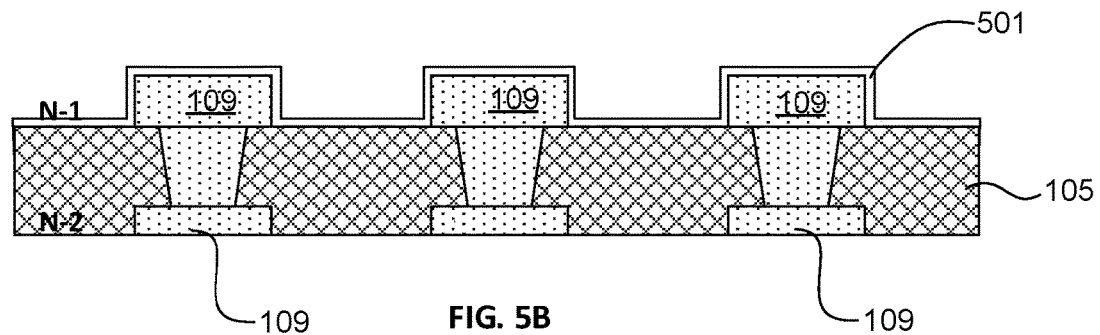

In the operation shown in FIG. 5B, first metal layer 501 is deposited conformally over substrate 200, covering the surface relief comprising pads 109 at conductor level N–1. In some embodiments, first metal layer 501 comprises metals such as, but not limited to, copper, aluminum and gold. In some embodiments, first metal layer 501 functions as a laser stop layer for operations utilizing laser skiving or drilling methods, described below. First metal layer 501 prevents laser damage to underlying dielectric 105.

In some embodiments, first metal layer 501 is formed by electroless deposition of copper or gold. In some embodiments, first metal layer 501 is formed by electroplating of copper or gold. In some embodiments, first metal layer 501 is formed by vacuum deposition of metals. In some embodiments, techniques such as DC and RF sputtering of a suitable metal are employed. In some embodiments, vacuum evaporation of a suitable metal is employed. In some embodiments, first metal layer 501 has a thickness ranging from 0.5 microns to 2 microns.

Figure 5C:
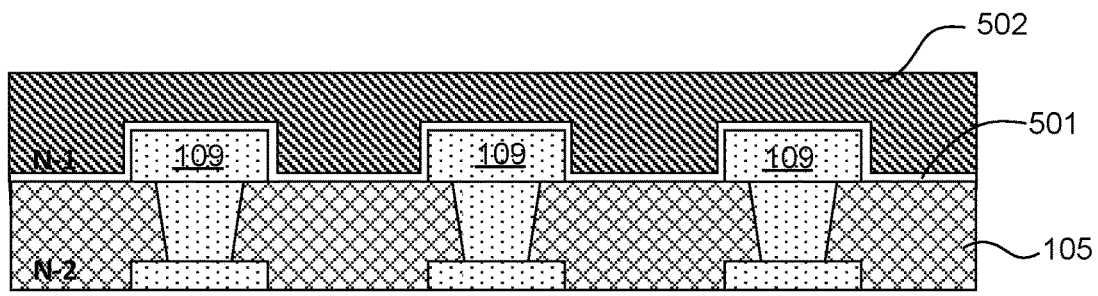

In the operation shown in FIG. 5C, release layer 502 is coated over the surface relief of substrate 200. In some embodiments, release layer 502 is polyimide, and is coated over the surface of substrate 200 in the liquid state. In some embodiments, release layer 502 is cured at temperatures above 100° C. In some embodiments, release layer 502 has a thickness ranging up to 10 microns. In some embodiments release layer is a dry film laminate.

Figure 5D:
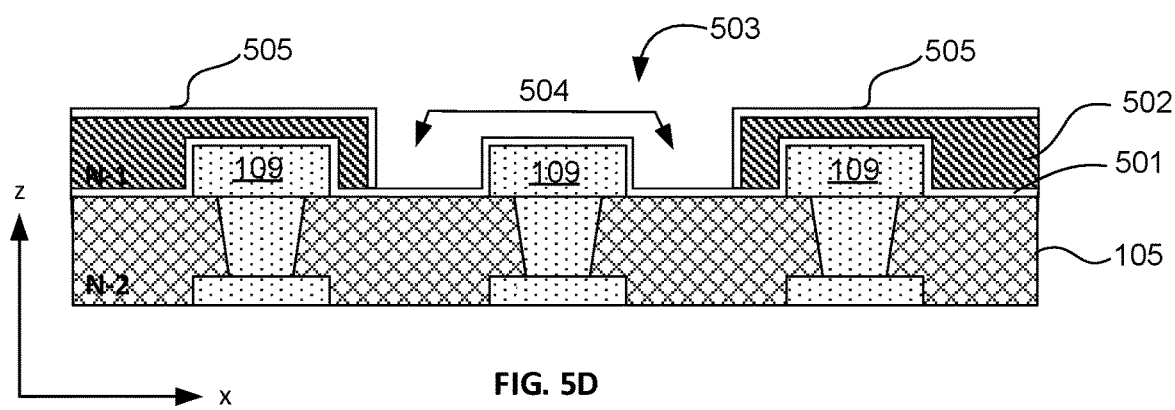

In the operation shown in FIG. 5D, release layer 502 is patterned. In some embodiments, laser skiving is employed to pattern release layer 502. During this operation, metal layer 501 functions as a laser stop layer, preventing the laser skiving process from damaging underlying dielectric 105. Patterning of release layer 502 forms opening 503 in selected region 504.

Still referring to FIG. 5D, after formation of opening 503 in release layer 502, a second metal layer 505 is formed over substrate 200. In some embodiments, second metal layer 505 is a conformal layer deposited over release layer 502, pads 109 and dielectric 105, overlaid by first metal layer 501. Second metal layer 505 comprises metals such as, but not limited to, copper, aluminum and gold. In some embodiments, second metal layer has a thickness of 0.1 micron to 2 microns.

In some embodiments, second metal layer 505 is formed by electroless deposition of copper. In some embodiments, second metal layer 505 is formed by DC or RF sputtering of a suitable metal. In some embodiments, second metal layer 505 is formed by evaporation of a suitable metal. In some embodiments, second metal layer 505 functions as an adhesion layer for laminating a dry film photoresist layer in a subsequent operation.

Figure 5E:
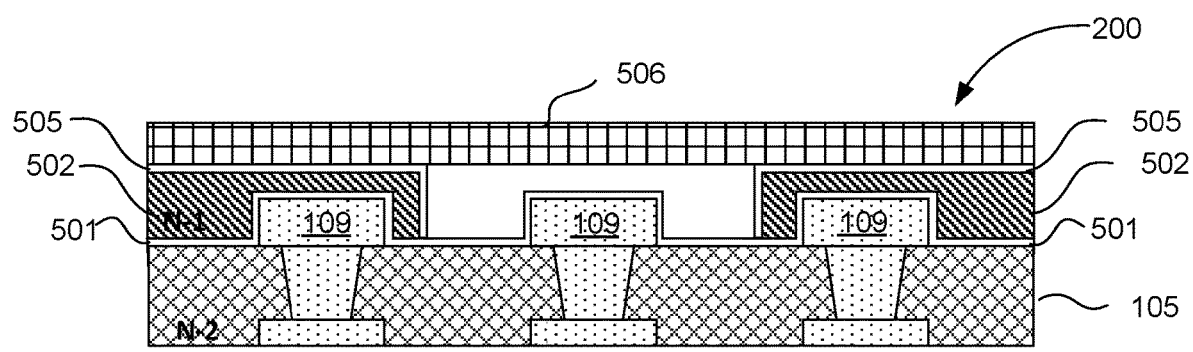

In the operation shown in FIG. 5E, photoresist layer 506 is made over second metal layer 505 on substrate 200. In some embodiments, photoresist layer 506 is a dry film resist laminate. In some embodiments, photoresist layer is laminated with film lamination equipment that is part of a standard POR.

Figure 5F:
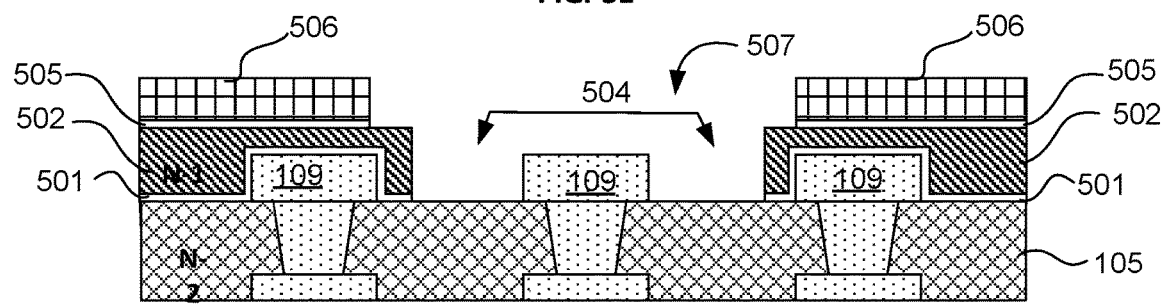

In the operation shown in FIG. 5F, photoresist layer 506 is patterned to form openings 507 over selected regions 504. In some embodiments, the process to pattern photoresist layer 506 is the same as that described for the operations shown in FIGS. 4E and 4F. Second metal layer 505 within opening 507 is removed by an etch process. In some embodiments, the etch process is a flash etch, similar to the etch process described in the operation shown in FIG. 4E.

Figure 5G:
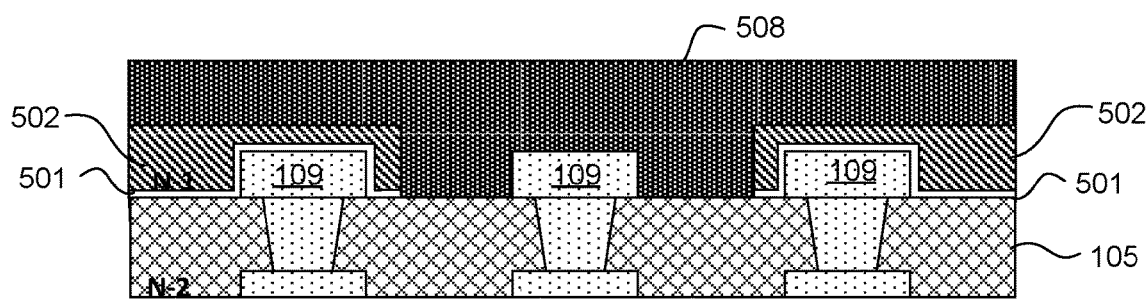

In the operation shown in FIG. 5G, photoresist layer 506 has been stripped in a previous operation. Suitable processes used for stripping photoresist layer 506 are similar to stripping processes described in the operation shown in FIG. 4F. Second metal layer 505 is subsequently removed in a flash etch process as described in the operation shown in FIG. 4E.

Still referring to FIG. 5G, magnetic film 508 is deposited over substrate 200. In some embodiments, magnetic film 508 conformally covers surface relief on substrate 200, comprising release film 501, pads 109 and dielectric 501. In some embodiments, magnetic film 406 is laminated by standard film lamination equipment that may be already present in existing processes of record (POR). In some embodiments, magnetic film 406 is first laminated over substrate 100, covering islands of release layer 401 (some portion covered by metal layer 402) then thermally activated for adhesion.

Figure 5H:
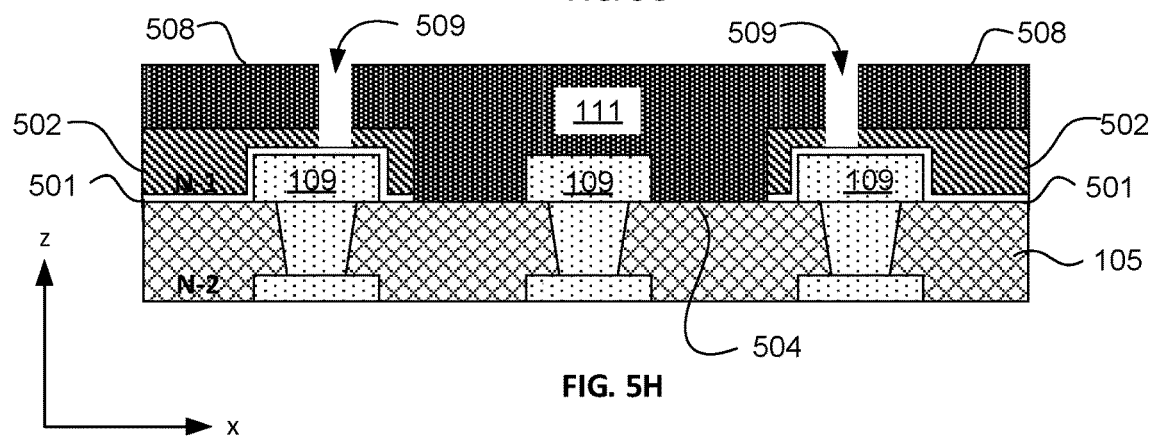

In the operation shown in FIG. 5H, magnetic film 508 is patterned to form planar magnetic structures 111 over selected region 504. In some embodiments, magnetic film 508 is patterned by laser ablation along cut lines 509, as described in the operation shown in FIG. 4G. In some embodiments, cut lines 509 are made at or near edges of underlying released layer 501. In some embodiments, cut lines 509 extend through underlying release layer 501 to first metal layer 501. In some embodiments, first metal layer 501 functions as a laser stop layer.

Figure 5I:
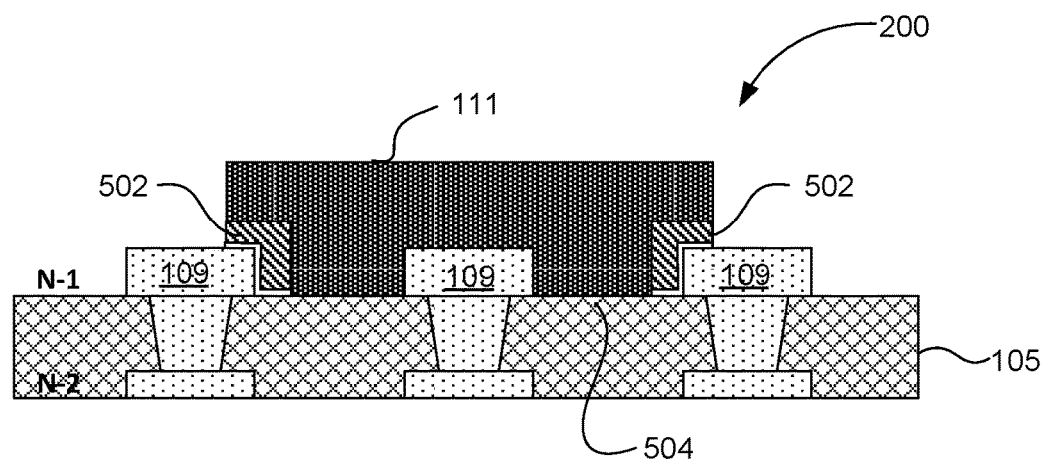

In the operation shown in FIG. 5I, release layer 502 is removed by mechanical delamination methods described above, leaving islands of planar magnetic structure 111 in selected regions 504. In the illustrated embodiment, remnants of release layer 502 remain between pads 109 and planar magnetic structure 111.

Figure 5J:
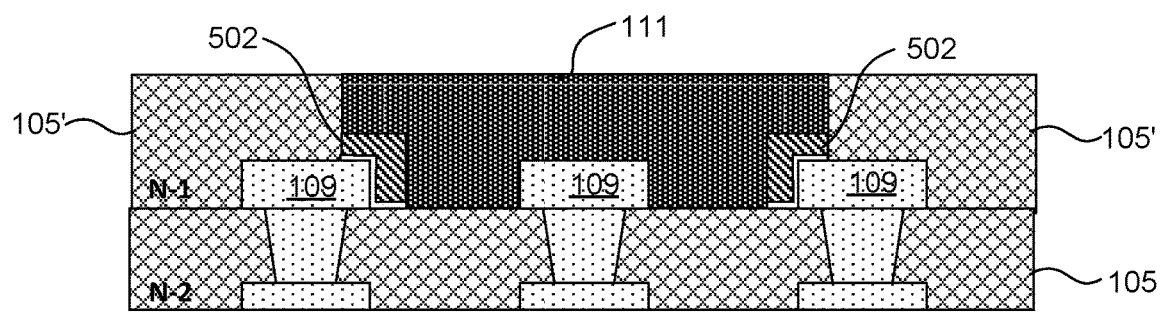

In the operation shown in FIG. 5J, dielectric layer 105' is formed over substrate 200, covering surface relief comprising planar magnetic structure 111, metallization structures such as pads 109, and dielectric 105. In some embodiments, dielectric layer 105' forms a conformal layer over the surface relief of substrate 200. In some embodiments, dielectric layer 105' is planarized with planar magnetic structure 111. In some embodiments, dielectric layer 105' is planarized by chemomechanical polishing (CMP) techniques.

Figure 5K:
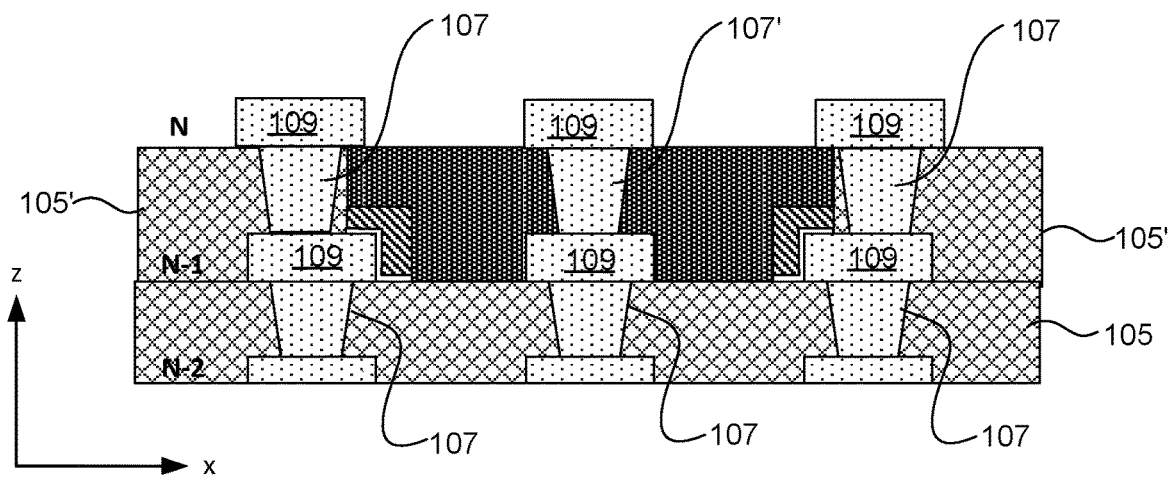

In the operation shown in FIG. 5K, level N conductor level 108' is added to substrate 200. In some embodiments, via 107' extends through planar magnetic structure 111 to interconnect conductor level N−1 to level N. In some embodiments, metallization structures comprising vias 107 and pads 109 are formed by operations that are standard in package assembly processes.

Figure 5L:
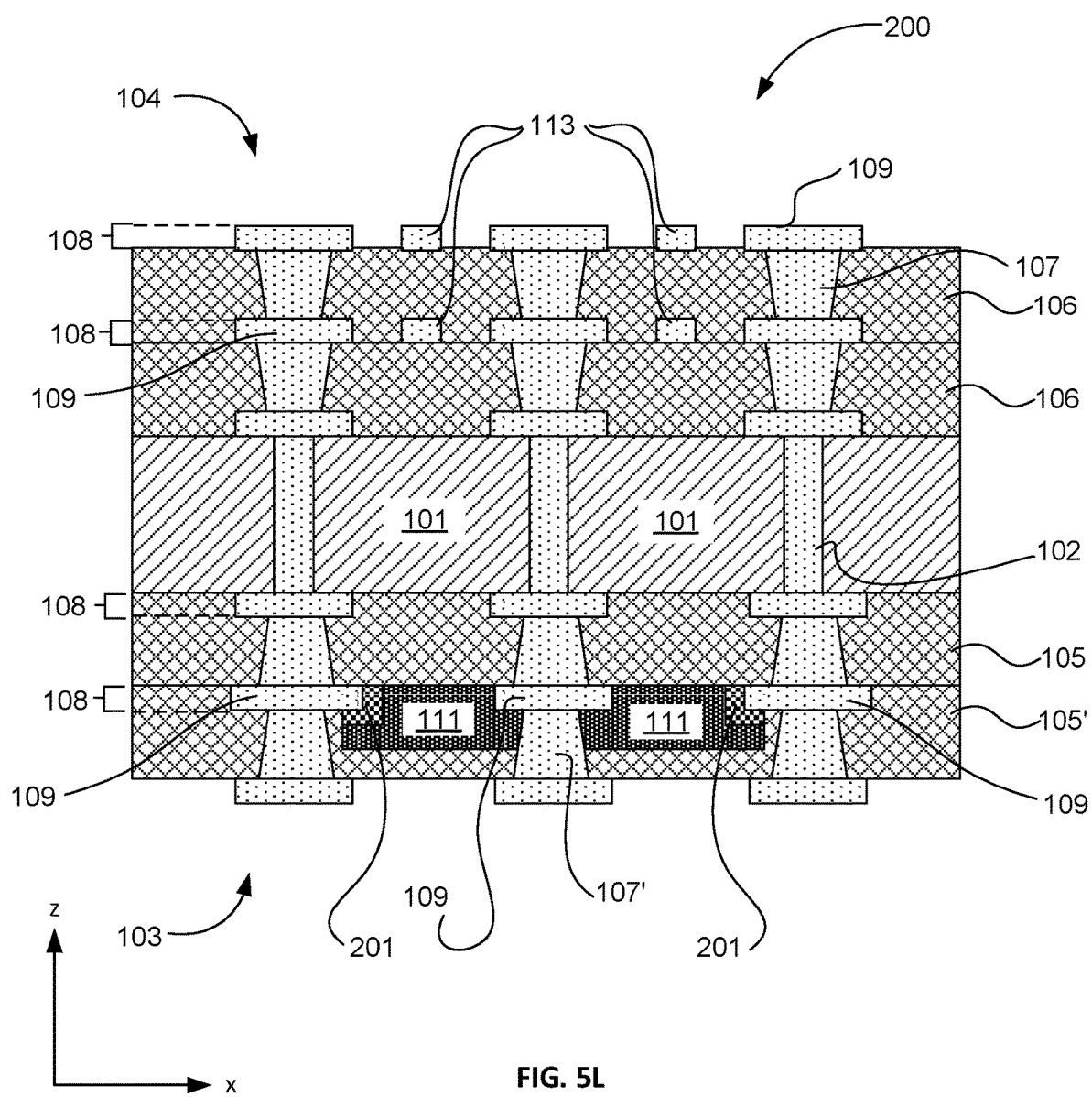

In FIG. 5L, substrate 200 is shown in the context of the completed structure as a whole, as shown in FIG. 2, including core 101, dielectric layers 105 and 106, and inductor windings 113. Metallization structures such as vias 107 are formed by known methods such as patterning of dielectric layers 105 and 106 by laser drilling and electroplating. In some embodiments, pads 109 are formed by first forming conductive levels 108 over dielectric layers 105 and 106 as these layers are made, by techniques such as electroless deposition of copper. Pads 109 may be formed by lithographic patterning of conductor levels 108. These techniques are typically standardized in package assembly processes of record (POR). In some embodiments, the addition of planar magnetic structures 111 in substrate 200 is implemented without significant modifications or additions to package assembly PORs.

Figure 6A:
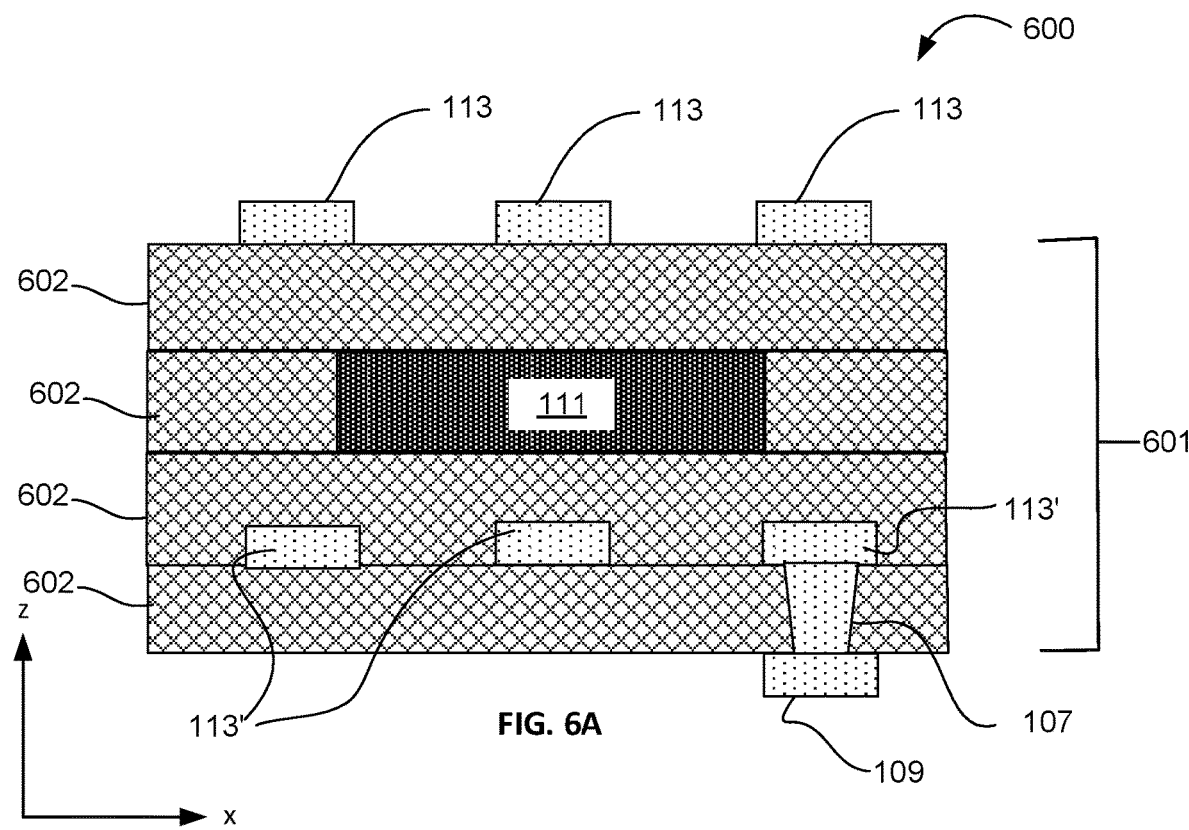
FIG. 6A illustrates a cross-sectional view of a solenoid inductor integrated in the substrate of the IC package having an organic magnetic film as the inductor core, according to some embodiments of the disclosure.

FIG. 6A illustrates a cross-sectional view of solenoid inductor 600 integrated in the substrate of the IC package having an organic magnetic film as the inductor core, according to some embodiments of the disclosure.

In FIG. 6A, an exemplary solenoid inductor 600 is integrated into substrate 601. Windings 113 and 113' are respectively above and below embedded planar magnetic structure 111. In some embodiments, planar magnetic structure 111 is the magnetic core of inductor 600. In some embodiments, windings 113 are formed in dielectric layers 602 by electrodeposition through a lithographically defined photomask during buildup of substrate 601. Windings 113 and 113' are interconnected by vias (not shown) that are out of the plane of the figure, extending through dielectric layers 602. In some embodiments, via 107 couples windings 113' to external pad 109.

Figure 6B:
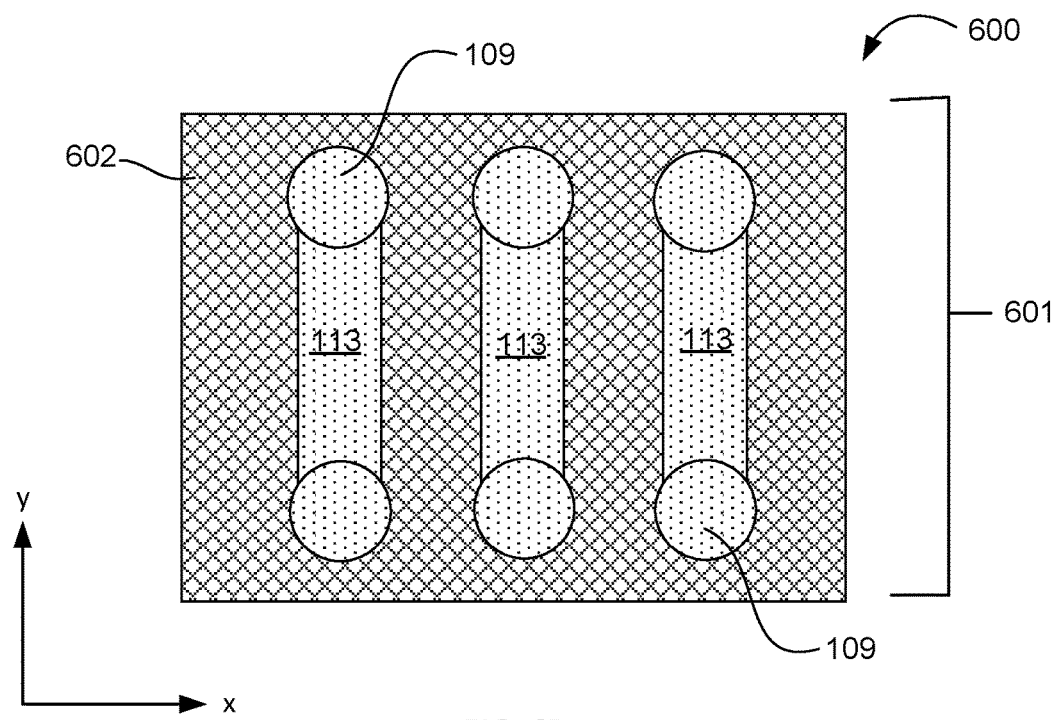
FIG. 6B illustrates a plan view of a solenoid inductor integrated in the substrate of the IC package having an organic magnetic film as the inductor core, according to some embodiments of the disclosure.

FIG. 6B illustrates a plan view of solenoid inductor 600 integrated in the substrate of the IC package having an organic magnetic film as the inductor core, according to some embodiments of the disclosure.

In FIG. 6B, the plan view shows windings 113 extending between pads 109 over a top dielectric layer 602 at the surface of substrate 601. In some embodiments, pads 109 terminate vias (not shown) that interconnect embedded windings 113' with windings 113.

Figure 7A:
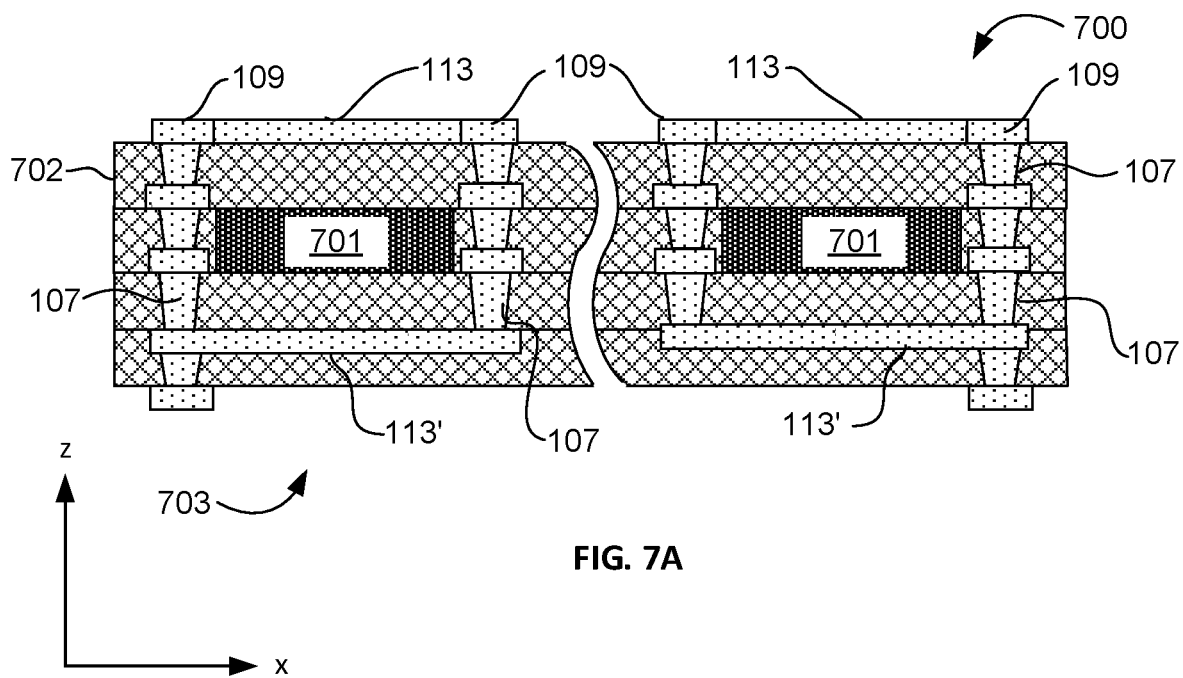
FIG. 7A illustrates a cross-sectional view of a toroidal inductor integrated in the substrate of the IC package having an organic magnetic film as the inductor core, according to some embodiments of the disclosure.

FIG. 7A illustrates a cross-sectional view of toroidal inductor 700 integrated in the substrate of the IC package having an organic magnetic film as the inductor core, according to some embodiments of the disclosure.

In FIG. 7A, toroidal inductor 700 comprises toroidal inductor core 701 embedded in dielectric 702. Windings formed by traces 113 and 113' surround toroidal inductor core 701. Traces 113 and 113' are interconnected by vias 107 to form inductor windings. In some embodiments, vias 107 terminate at pads 109.

Figure 7B:
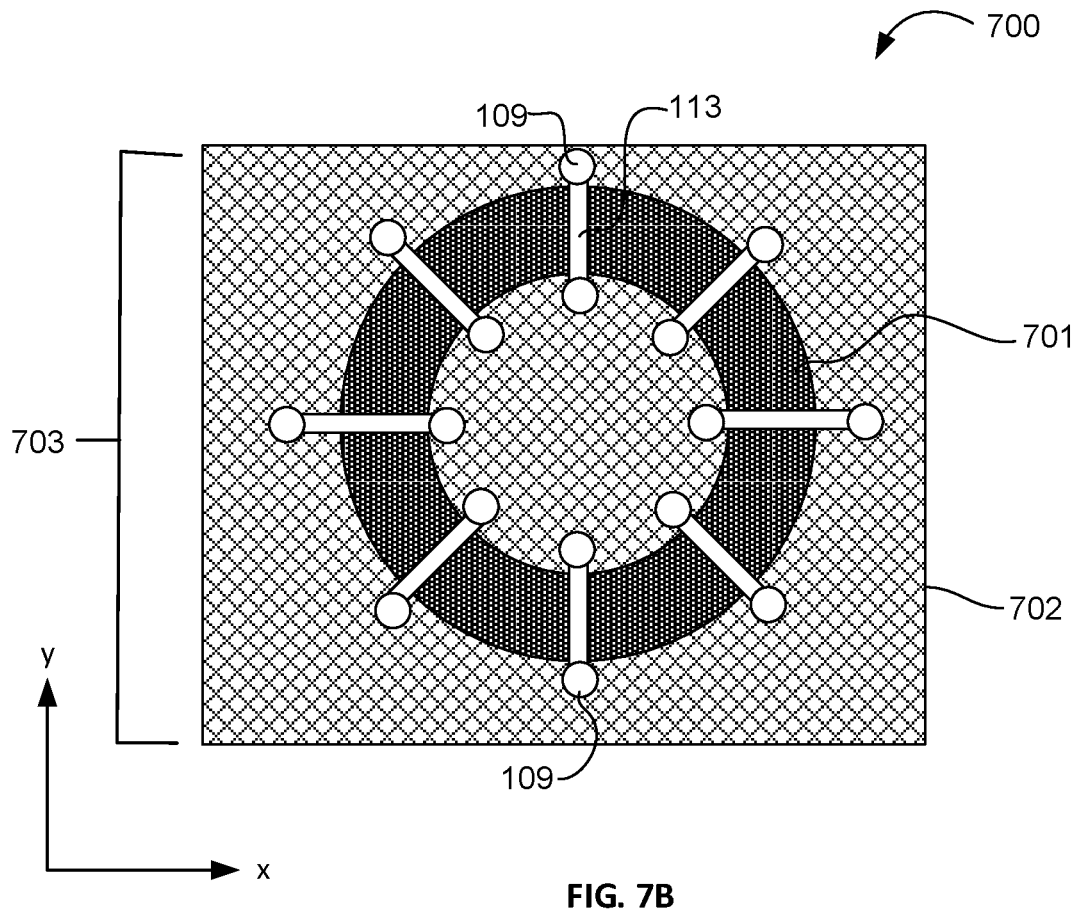
FIG. 7B illustrates a plan view of a toroidal inductor integrated in the substrate of the IC package having an organic magnetic film as the inductor core, according to some embodiments of the disclosure.

FIG. 7B illustrates a plan view of toroidal inductor 700 integrated in the substrate of the IC package having an organic magnetic film as the inductor core, according to some embodiments of the disclosure.

In the illustrated embodiment shown in FIG. 7B, core 701 is circular, with traces 113 extending across the body of core 701. Pads 109 terminate vias 107 (FIG. 7A) on the surface of substrate 703.

Figure 8:
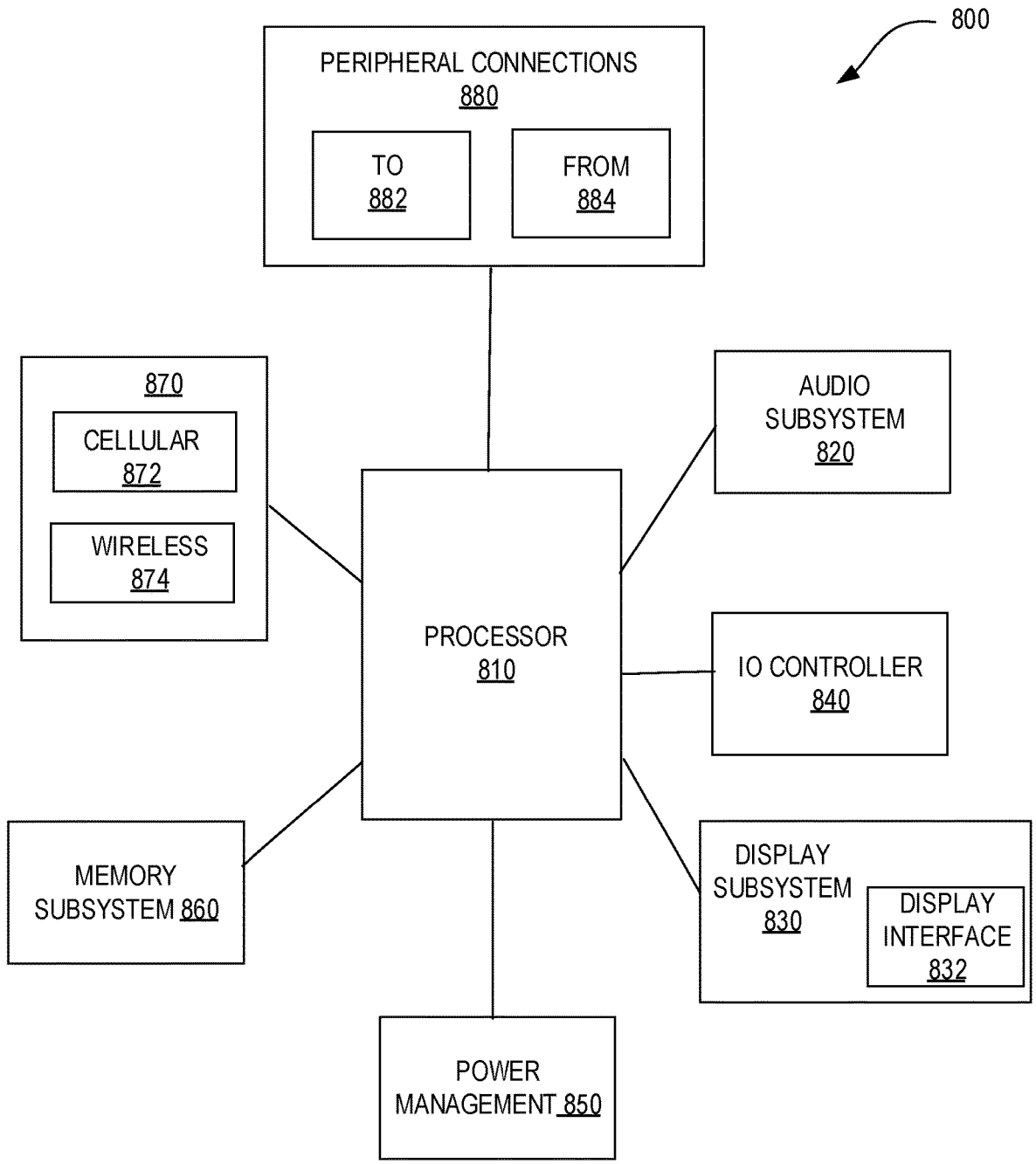
FIG. 8 illustrates a package having an embedded inductor core within the package substrate, fabricated according to the disclosed method, as part of a system-on-chip (SoC) package in an implementation of computing device, according to some embodiments of the disclosure.

FIG. 8 illustrates a package having an embedded inductor core within the package substrate, fabricated according to the disclosed method, as part of a system-on-chip (SoC) package in an implementation of computing device, according to some embodiments of the disclosure.

FIG. 8 illustrates a block diagram of an embodiment of a mobile device in which flat surface interface connectors could be used. In some embodiments, computing device 800 represents a mobile computing device, such as a computing tablet, a mobile phone or smart-phone, a wireless-enabled e-reader, or other wireless mobile device. It will be understood that certain components are shown generally, and not all components of such a device are shown in computing device 800.

In some embodiments, computing device 800 includes a first processor 810. The various embodiments of the present disclosure may also comprise a network interface within 870 such as a wireless interface so that a system embodiment may be incorporated into a wireless device, for example, cell phone or personal digital assistant.

In one embodiment, processor 810 can include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting the computing device 800 to another device. The processing operations may also include operations related to audio I/O and/or display I/O.

In one embodiment, computing device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 800, or connected to the computing device 800. In one embodiment, a user interacts with the computing device 800 by providing audio commands that are received and processed by processor 810.

Display subsystem 830 represents hardware (e.g., display devices) and software (e.g., drivers) components that provide a visual and/or tactile display for a user to interact with the computing device 800. Display subsystem 830 includes display interface 832 which includes the particular screen or hardware device used to provide a display to a user. In one embodiment, display interface 832 includes logic separate from processor 810 to perform at least some processing related to the display. In one embodiment, display subsystem 830 includes a touch screen (or touch pad) device that provides both output and input to a user.

I/O controller 840 represents hardware devices and software components related to interaction with a user. I/O controller 840 is operable to manage hardware that is part of audio subsystem 820 and/or display subsystem 830. Additionally, I/O controller 840 illustrates a connection point for additional devices that connect to computing device 800 through which a user might interact with the system. For example, devices that can be attached to the computing device 800 might include microphone devices, speaker or stereo systems, video systems or other display devices, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of the computing device 800. Additionally, audio output can be provided instead of, or in addition to display output. In another example, if display subsystem 830 includes a touch screen, the display device also acts as an input device, which can be at least partially managed by I/O controller 840. There can also be additional buttons or switches on the computing device 800 to provide I/O functions managed by I/O controller 840.

In one embodiment, I/O controller 840 manages devices such as accelerometers, cameras, light sensors or other environmental sensors, or other hardware that can be included in the computing device 800. The input can be part of direct user interaction, as well as providing environmental input to the system to influence its operations (such as filtering for noise, adjusting displays for brightness detection, applying a flash for a camera, or other features).

In one embodiment, computing device 800 includes power management 850 that manages battery power usage, charging of the battery, and features related to power saving operation. Memory subsystem 860 includes memory devices for storing information in computing device 800. Memory can include nonvolatile (state does not change if power to the memory device is interrupted) and/or volatile (state is indeterminate if power to the memory device is interrupted) memory devices. Memory subsystem 860 can store application data, user data, music, photos, documents, or other data, as well as system data (whether long-term or temporary) related to the execution of the applications and functions of the computing device 800.

Elements of embodiments are also provided as a machine-readable medium (e.g., memory 860) for storing the computer-executable instructions. The machine-readable medium (e.g., memory 860) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 870 includes hardware devices (e.g., wireless and/or wired connectors and communication hardware) and software components (e.g., drivers, protocol stacks) to enable the computing device 800 to communicate with external devices. The computing device 800 could be separate devices, such as other computing devices, wireless access points or base stations, as well as peripherals such as headsets, printers, or other devices.

Network interface 870 can include multiple different types of connectivity. To generalize, the computing device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 874 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 880 include hardware interfaces and connectors, as well as software components (e.g., drivers, protocol stacks) to make peripheral connections. It will be understood that the computing device 800 could both be a peripheral device ("to" 882) to other computing devices, as well as have peripheral devices ("from" 884) connected to it. The computing device 800 commonly has a "docking" connector to connect to other computing devices for purposes such as managing (e.g., downloading and/or uploading, changing, synchronizing) content on computing device 800. Additionally, a docking connector can allow computing device 800 to connect to certain peripherals that allow the computing device 800 to control content output, for example, to audiovisual or other systems.

In addition to a proprietary docking connector or other proprietary connection hardware, the computing device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The various examples can be multiple dependent. For example, example 4 may depend from example 3, 2, or 1.

Example 1

A substrate for an integrated circuit package, the substrate comprising: a dielectric; at least one conductor plane within the dielectric; and a planar magnetic structure comprising a magnetic laminate embedded within the dielectric, wherein the magnetic laminate comprises an organic material, and wherein the planar magnetic structure is integrated within the at least one conductor plane.

Example 2

The substrate of example 1, wherein the magnetic laminate includes magnetic particles embedded in a polymer matrix, and wherein the organic material includes the polymer matrix which comprises an epoxy resin.

Example 3

The substrate of example 2, wherein the magnetic particles comprise one of: gamma-ferric oxide, magnetite, iron, nickel, cobalt, molybdenum, manganese, lanthanide series elements or a Heusler alloy.

Example 4

The substrate of example 1 comprises a core having a first side and a second side opposite the first side, wherein the planar magnetic structure is integrated over one of: the first side of the core or the second side of the core.

Example 5

The substrate of example 1, wherein the planar magnetic structure has an interface with one or more copper structures within the at least one conductor plane.

Example 6

The substrate of example 1, wherein the planar magnetic structure has a conformal interface with one or more copper structures within the at least one conductor plane.

Example 7

The substrate of example 5, wherein a release film intervenes between the planar magnetic structure and the one or more copper structures.

Example 8

The substrate of example 1, wherein the dielectric comprises an organic laminate, and wherein the planar magnetic structure has an interface with the organic laminate.

Example 9

The substrate of example 1, wherein the conductor plane is a first conductor plane, and wherein the planar magnetic structure is interleaved between the first conductor plane and a second conductor plane.

Example 10

The substrate of example 1, wherein the planar magnetic structure has a relative magnetic permeability ranging between 5 and 20.

Example 11

The substrate of example 1, wherein the planar magnetic structure has a thickness of at least 20 microns.

Example 12

The substrate of example 1, wherein the substrate is a coreless substrate.

Example 13

The substrate of example 1, wherein the planar magnetic structure is a planar inductor core.

Example 14

The substrate of example 13 comprises an inductor winding over the planar inductor core.

Example 15

The substrate of example 14 comprises a substrate core, wherein the planar inductor core is over a first side of the substrate core, and the inductor winding is over a second side of the substrate core.

Example 16

A system, comprising: a memory; a processor coupled to the memory, wherein the processor comprises: a substrate, comprising: a dielectric; at least one conductor plane within the dielectric; and a planar magnetic structure comprising an organic magnetic laminate embedded within the dielectric, wherein the planar magnetic structure is integrated within the at least one conductor plane; and a wireless transceiver to allow the processor to communicate wirelessly to an external device.

Example 17

The system of example 16, wherein the substrate further comprises an inductor winding, wherein the planar magnetic structure comprises a planar inductor core, and wherein the inductor winding is over the planar inductor core.

Example 18

A method, comprising: forming a substrate comprising a dielectric and a conductor plane over the dielectric; patterning the conductor plane to form metal structures over the dielectric; forming one or more islands of an anti-adhesion film, wherein the one or more islands of the anti-adhesion film have a partial interface with the metal structures and the dielectric; laminating a magnetic film over the substrate, wherein the magnetic film has an interface with the one or more islands of the anti-adhesion film, the metal structures and the dielectric; and forming islands of magnetic film over the metal structures and the dielectric.

Example 19

The method of example 18, wherein forming the one or more islands of anti-adhesion film comprises printing an anti-adhesion paste over selected regions of the substrate, wherein the selected regions of the substrate comprise the metal structures and the dielectric.

Example 20

The method of example 18, wherein forming the one or more islands of anti-adhesion film comprises: laminating an anti-adhesion film over the substrate; and patterning the anti-adhesion film to expose selected regions of the substrate by laser ablation.

Example 21

An apparatus, comprising: a substrate, comprising: a dielectric; at least one conductor plane within the dielectric; and a planar magnetic structure comprising an organic magnetic laminate embedded within the dielectric, wherein the planar magnetic structure is integrated within the at least one conductor plane.

Example 22

The apparatus of example 21, wherein the planar magnetic structure is a magnetic film comprising magnetic particles embedded in a polymer matrix.

Example 23

The apparatus of example 21, wherein the substrate comprises a core having a first side and a second side opposite the first side, and wherein the planar magnetic structure is integrated over one of: the first side of the core or the second side of the core.

Example 24

The apparatus of example 23, wherein the planar magnetic structure is a first planar magnetic structure, and wherein the first planar magnetic structure is integrated over the first side of the core, and a second planar magnetic structure is integrated over the second side of the core.

Example 25

The apparatus of example 21, wherein the planar magnetic structure has an interface with one or more copper structures within the at least one conductor plane.

Example 26

The apparatus of example 21, wherein the planar magnetic structure has a conformal interface with one or more copper structures within the at least one conductor plane.

Example 27

The apparatus of example 25, wherein a release film intervenes between the planar magnetic structure and the one or more copper structures.

Example 28

The apparatus of example 21, wherein the dielectric comprises at least one organic laminate, and wherein the planar magnetic structure has an interface with the at least one organic laminate.

Example 29

The apparatus of example 21, wherein at least one copper structure extends through the magnetic structure.

Example 30

The apparatus of example 29, wherein the at least one copper structure is a via.

Example 31

The apparatus of example 21, wherein the conductor plane is a first conductor plane, and wherein the planar magnetic structure is interleaved between the first conductor plane and a second conductor plane.

Example 32

The apparatus of example 21, wherein the planar magnetic structure comprises ferromagnetic particles.

Example 33

The apparatus of example 21, wherein the planar magnetic structure comprises paramagnetic particles.

Example 34

The apparatus of example 21, wherein the planar magnetic structure has a relative magnetic permeability ranging between 5 and 20.

Example 35

The apparatus of example 21, wherein the planar magnetic structure has a thickness of at least 20 microns.

Example 36

The apparatus of example 21, wherein the substrate is a coreless substrate.

Example 37

The apparatus of example 21, wherein the planar magnetic structure is a planar inductor core.

Example 38

The apparatus of example 27, wherein the substrate comprises an inductor winding over the planar inductor core.

Example 39

The apparatus of example 28, wherein the inductor winding is within at least one conductor plane of the substrate.

Example 40

The apparatus of example 28, wherein at least a portion of the inductor winding is within a conductor plane over the plane of the planar inductor core, and at least a portion of the inductor winding is over the planar inductor core.

Example 41

The apparatus of example 28, wherein the inductor winding is a planar spiral winding within one conductor plane, and wherein at least a portion of the spiral winding is over the planar inductor core.

Example 42

The apparatus of example 28, wherein the inductor winding is a solenoid winding, wherein a first segment of the solenoid winding is within a first conductor plane, and a second segment of the solenoid winding is within a second conductor plane and is coupled to the first segment, and wherein the planar inductor core is between the first segment of the solenoid winding and the second segment of the solenoid winding.

Example 43

The apparatus of example 28, wherein the inductor winding is a toroidal winding, wherein a first segment of the toroidal winding is within a first conductor plane, and a second segment of the toroidal winding is within a second conductor plane and is coupled to the first segment, and wherein the planar inductor core has a toroidal shape, and is between the first segment of the toroidal winding and the second segment of the toroidal winding.

Example 44

The apparatus of example 28, wherein the substrate comprises a substrate core, wherein the planar inductor core is over a first side of the substrate core, and the inductor winding is over a second side of the substrate core.

Example 45

A system, comprising: a memory; a processor coupled to the memory, wherein the processor comprises according to examples 1 to 15; or examples 21 to 44; and a wireless interface to allow the processor to communicate with another device.

Example 46

A method, comprising: receiving a substrate comprising a dielectric and a conductor plane over the dielectric; patterning the conductor plane to form copper structures over the dielectric; forming one or more islands of an anti-adhesion film, wherein the one or more islands of the anti-adhesion film have a partial interface with the copper structures and the dielectric; laminating a magnetic film over the substrate, wherein the magnetic film has an interface with the one or more islands of the anti-adhesion film, the copper structures and the dielectric; and forming islands of magnetic film over the copper structures and the dielectric.

Example 47

The method of example 46, wherein forming the one or more islands of anti-adhesion film comprises printing an anti-adhesion paste over selected regions of the substrate, wherein the selected regions of the substrate comprise the copper structures and the dielectric.

Example 48

The method of example 46, wherein forming the one or more islands of anti-adhesion film comprises: laminating an anti-adhesion film over the substrate; and patterning the anti-adhesion film to expose selected regions of the substrate.

Example 49

The method of example 48, wherein patterning the anti-adhesion film comprises patterning the anti-adhesion film by laser ablation.

Example 50

The method of example 46, wherein forming islands of magnetic film over the copper structures and the dielectric comprises: separating the magnetic film at edges of the islands of the anti-adhesion film, wherein islands of magnetic film having an interface with islands of anti-adhesion film are separated from islands of magnetic film having an interface with the copper structures and the dielectric.

Example 51

The method of example 50, wherein separating the magnetic film at the edges of the islands of the anti-adhesion film comprises: removing the anti-adhesion film from selected regions of the substrate, wherein islands of anti-adhesion film are formed; depositing a film comprising a metal over the islands anti-adhesion film and the selected regions of the substrate; laminating a photoresist over the film comprising a metal; patterning the photoresist to form openings over the selected regions of the substrate; etching the film comprising a metal in the selected regions; removing the photoresist film; laminating the magnetic film over the substrate, wherein the magnetic film has an interface with the islands of anti-adhesion film and with the selected regions of the substrate; forming separations in the magnetic film near the edges of the selected regions, wherein the separations form islands of magnetic film having an interface with the anti-adhesion film and islands of magnetic film having an interface with the selected regions of the substrate; and removing the islands of magnetic film having an interface with the anti-adhesion film.

Example 52

The method of example 51, wherein forming separations in the magnetic film comprises forming cuts in the magnetic film near the edges of the selected regions by laser ablation of the magnetic film and the anti-adhesion film.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A substrate for an integrated circuit package, the substrate comprising:
   a substrate core;
   a dielectric over a first side of the substrate core;
   at least one conductor plane within the dielectric; and
   a planar magnetic structure comprising a magnetic laminate embedded within the dielectric, wherein the magnetic laminate comprises an organic material, and wherein the planar magnetic structure overlaps one or more first metal features of the conductor plane and two opposing side edges of the magnetic laminate intersect the one or more first metal features, wherein the planar magnetic structure is a planar inductor core and wherein a second conductor plane comprises an inductor winding over the planar inductor core and on a second side of the substrate core.

2. The substrate of claim 1, wherein the magnetic laminate includes magnetic particles embedded in a polymer matrix, and wherein the organic material includes the polymer matrix which comprises an epoxy resin.

3. The substrate of claim 2, wherein the magnetic particles comprise one of: gamma-ferric oxide, magnetite, iron, nickel, cobalt, molybdenum, manganese, lanthanide series elements or a Heusler alloy.

4. The substrate of claim 1, further comprising a core having a first side and a second side opposite the first side, wherein the planar magnetic structure is integrated over one of the first side of the core or the second side of the core.

5. The substrate of claim 1, wherein the magnetic laminate has an interface with the first metal features.

6. The substrate of claim 5, wherein a release film is between the magnetic laminate and the first metal features, and wherein an edge of the release film is also over the first metal features.

7. The substrate of claim 1, wherein the magnetic laminate has a conformal interface with the first metal features.

8. The substrate of claim 1, wherein the dielectric comprises an organic laminate, and wherein the magnetic laminate has an interface with the organic laminate.

9. The substrate of claim 1, wherein the planar magnetic structure is interleaved between the first conductor plane and a second conductor plane that is over the magnetic laminate.

10. The substrate of claim 1, wherein the planar magnetic structure has a relative magnetic permeability ranging between 5 and 20.

11. The substrate of claim 1, wherein the planar magnetic structure has a thickness of at least 20 microns.

12. A system, comprising:
a memory;
a processor coupled to the memory; and
a wireless transceiver to allow the processor to communicate wirelessly to an external device, wherein at least one of the processor, memory or wireless transceiver are within an integrated circuit package comprising the substrate of claim 1.

* * * * *